United States Patent
Kitabayashi

(10) Patent No.: US 8,864,261 B2
(45) Date of Patent: Oct. 21, 2014

(54) NOZZLE DISCHARGE QUANTITY CORRECTION METHOD, DROPLET DISCHARGING METHOD, AND ORGANIC EL DEVICE MANUFACTURING METHOD

(75) Inventor: Atsushi Kitabayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 164 days.

(21) Appl. No.: 13/428,460

(22) Filed: Mar. 23, 2012

(65) Prior Publication Data

US 2012/0249636 A1 Oct. 4, 2012

(30) Foreign Application Priority Data

Mar. 30, 2011 (JP) .................. 2011-075810

(51) Int. Cl.
*B41J 29/38* (2006.01)
*B41J 2/045* (2006.01)

(52) U.S. Cl.
CPC .......... *B41J 2/04581* (2013.01); *B41J 2/04506* (2013.01); *H01J 51/0005* (2013.01); *B41J 2/0459* (2013.01); *B41J 2/0456* (2013.01); *B41J 2202/09* (2013.01)
USPC .......................................................... 347/10

(58) Field of Classification Search
CPC ....................................................... B41J 2/0456
USPC ........................................................... 347/10
See application file for complete search history.

(56) References Cited

U.S. PATENT DOCUMENTS

| | | | |
|---|---|---|---|
| 7,314,264 B2 | 1/2008 | Sato et al. | |
| 7,798,592 B2 * | 9/2010 | Mizugaki | 347/15 |
| 8,561,570 B2 | 10/2013 | Komori et al. | |
| 2008/0158276 A1 * | 7/2008 | Kubota | 347/10 |

FOREIGN PATENT DOCUMENTS

| | | |
|---|---|---|
| JP | A-2006-021146 | 1/2006 |
| JP | A-2006-035041 | 2/2006 |
| JP | A-2008-136927 | 6/2008 |
| JP | A-2008-276088 | 11/2008 |
| JP | A-2009-117140 | 5/2009 |
| JP | A-2010-227762 | 10/2010 |

* cited by examiner

*Primary Examiner* — Matthew Luu
*Assistant Examiner* — Tracey McMillion
(74) *Attorney, Agent, or Firm* — Oliff PLC

(57) ABSTRACT

A nozzle discharge quantity correction method includes performing correction quantity calculation as the number of the nozzle array units in stages such that a total sum C of the weight of droplets in nozzle array units after correction and the weight of the droplets in other nozzle array units in which discharge is performed on the discharge region becomes a previously set predetermined quantity B based on the difference between the total sum A of the weight of all the droplets discharged to a discharge region when the weight of the droplets discharged from a nozzle are not corrected and the predetermined quantity B.

17 Claims, 18 Drawing Sheets

FIG. 9
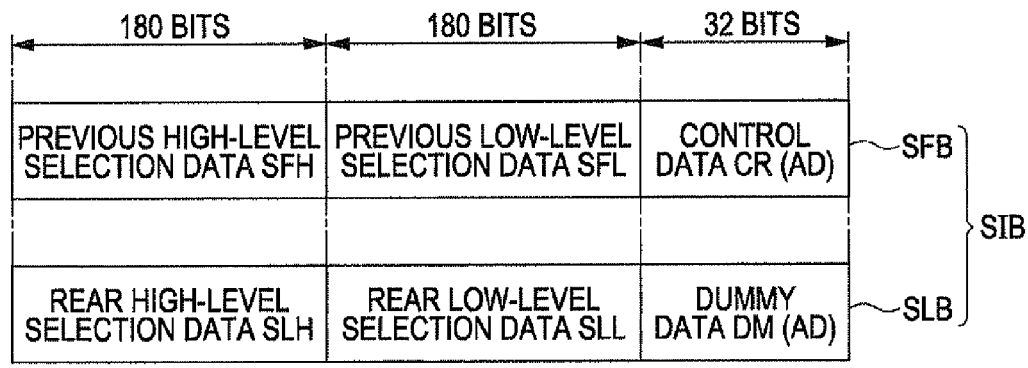
FIG. 10
| SFH | SFL | COMF |
|---|---|---|
| 0 | 0 | COMA |
| 0 | 1 | COMB |
| 1 | 0 | COMC |
| 1 | 1 | COMD |
| SLH | SLL | COML |
|---|---|---|
| 0 | 0 | COMA |
| 0 | 1 | COMB |
| 1 | 0 | COMC |
| 1 | 1 | COMD |
FIG. 11
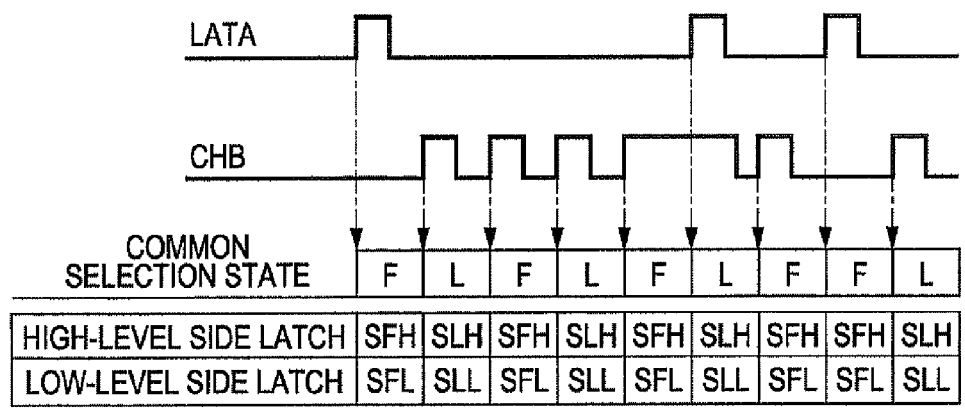

NOZZLE DISCHARGE QUANTITY CORRECTION METHOD, DROPLET DISCHARGING METHOD, AND ORGANIC EL DEVICE MANUFACTURING METHOD

BACKGROUND

1. Technical Field

The present invention relates to a nozzle discharge quantity correction method, a droplet discharging method, and an organic Electroluminescent (EL) device manufacturing method.

2. Related Art

According to the related art, a droplet discharging method (ink jet method) of forming a thin film by discharging liquid, containing a functional ingredient, from the nozzles of an ink jet head in the form of droplets has been known. A representative example of a thin film which is formed using the droplet discharging method is the emission layer of a color filter or an organic EL panel.

An ink jet head includes a plurality of cavities which store liquid, a plurality of nozzles which are in communication with the corresponding cavities and which are arranged in one direction, and a plurality of actuators (for example, piezoelectric elements, resistive heating elements, or the like) which pressurize the liquid in each of the cavities. The ink jet head receives a driving waveform signal which is common to the actuators which are selected based on the drawing data, and discharges droplets of liquid from the nozzles corresponding to the respective actuators. The ink jet method causes a thin film to be formed by discharging to a substrate liquid in the form of droplets from the nozzles of the ink jet head and then drying the droplets deposited on the substrate.

It is desirable that the ink jet method enable drawing which has excellent half-tones when a drawing target is displayed in high definition, and, for example, JP-A-2008-136927 discloses a droplet discharge head driving method enabling drawing which has excellent half-tones.

According to the droplet discharge head driving method, a plurality of different driving waveform signals corresponding to ranks which are set to an actuator are applied to nozzles selected based on the drawing data, so that the average weight of the droplets which are discharged can be determined as a predetermined weight which was predefined. Therefore, when the driving waveform signals generated for the respective ranks are combined, the total weight of the liquid (droplets) which is discharged onto a target can be calibrated for each nozzle, and the uniformity of film thickness obtained by drying the liquid can be improved. Furthermore, compared to the case where droplets are discharged using a single driving waveform signal, JP-A-2008-136927 discloses that the degree of accuracy, obtained when the average weight is adjusted, can be improved, and that the degree of freedom can be enlarged by just combining different driving waveform signals.

However, in the droplet discharge head driving method of ranking the average weight of the plurality of droplets, which is disclosed in JP-A-2008-136927, the gray scale to be ranked is limited, so that it is difficult to sufficiently correct the dispersion of the weight of the droplets.

When the dispersion of the weight of the droplets is not sufficiently corrected, heavy-weight droplets or light-weight droplets are continued along the scanning direction of a substrate. Therefore, even when the weight difference between the heavy weight droplets and the light weight droplets is minute, the difference is generated in the film thickness of a thin film, such as the emission layer of the color filter or the organic EL panel or the like, and the difference in the film thickness is reflected as high sensitivity when an electro-optical device performs display, so that there is a problem of lowering the image quality.

SUMMARY

An advantage of some aspects of the invention may be realized as the forms or application examples below.

APPLICATION EXAMPLE 1

According to an aspect of the invention, there is provided a nozzle discharge quantity correction method in which one of a plurality of different driving waveform signals is selected, and the selected driving waveform signal to an actuator of each nozzle of nozzle arrays is supplied, and the weight of droplets which are discharged from the nozzle to a discharge region is corrected, the method including performing first correction calculation in first nozzle array units, in discharge units, or in scanning units on each nozzle such that a total sum C of the weight of the droplets, obtained after the correction, in the first nozzle array units, in the discharge units, or in the scanning units, and the weight of droplets which are discharged to the same discharge region from the nozzle array units excluding the first nozzle array units, in the discharge units, or in the scanning units, becomes the predetermined quantity B, based on a difference between a total sum A of the weight of all the droplets which are discharged to the discharge region when the weight of the droplets is not corrected for each nozzle and a predetermined quantity B; performing second correction calculation in second nozzle array units, in discharge units, or in scanning units on each nozzle such that a total sum E of the weight of the droplets after the correction in the first nozzle array units, in the discharge units, or in the scanning units, the weight of droplets after the correction which are discharged to the same discharge region in the second nozzle array units, in the discharge units, or in the scanning units, and weight of droplets which are discharged to the same discharge region in nozzle array units excluding the first and second nozzle array units, in the discharge units, or in the scanning units, becomes the previously set predetermined quantity B based on a difference between a total sum D of the weight of all the droplets discharged to the discharge region based on the calculation corrected in the performing of the first correction calculation, and the previously set predetermined quantity B; and performing the correction quantity calculation as the number of the nozzle array units, the discharge units, or the scanning units in stages.

According to the Application Example 1, since the correction is performed such that the total sums A and C of the weight of all the droplets of the discharge region becomes the predetermined quantity B in the single nozzle array units, the discharge units, or the scanning units, correction gray scales may be exponentially multiplied to as many as the number of the nozzle array units, the discharge units, or the scanning units from which the droplets are discharged to the discharge region. Therefore, variation in the weight of the droplets discharged from each nozzle may be sufficiently corrected, so that the film thickness of a thin film formed on the discharge region can be made uniform using a plurality of nozzles.

APPLICATION EXAMPLE 2

It is preferable that the order of the correction quantity calculation of the weight of the droplets may not be the same as the order of the nozzle array units, the discharge units, or the scanning units from which the droplets are discharged to the same discharge region from the nozzle.

According to the Application Example 2, since the actual order of the discharging droplets is not restricted, the discharge may be performed with enhanced flexibility, so that optimal discharge may be performed on a target to which the droplets are discharged.

APPLICATION EXAMPLE 3

It is preferable that selected nozzles in the nozzle array units, the discharge units, or the scanning units from which the droplets are discharged to the same discharge region from the nozzle may not be the same.

According to the Application Example 3, discharge is performed to the discharge region using different nozzles for the respective nozzle array units, discharge units, or scanning units. Therefore, in the case where errors are generated when the weight of the droplets discharged from each nozzle are measured, the errors may be dispersed, so that the variation in the weight of the droplets may be sufficiently corrected.

APPLICATION EXAMPLE 4 it is preferable that the number of times that the droplets are discharged in the nozzle array units, the discharge units, or the scanning units in which the droplets are discharged to the same discharge region may not be the same.

According to the Application Example 4, since the number of times that the droplets are discharged may be freely set according to the discharge region, the variation in the weight of the droplets may be sufficiently corrected while the optimal weight of the droplets is discharged to the discharge region.

APPLICATION EXAMPLE 5

It is preferable that the correction of the weight of the droplets for each nozzle may be performed by selecting one of the plurality of different driving waveform signals which are arranged in a temporal sequence.

According to the Application Example 5, a droplet weight correction section is not limited to a method of selecting one of the plurality of different driving waveform signals using multicommon, and may use a method of selecting one of time driving waveform signals. Even in the case of an ink jet head which does not include multicommon, the variation in the weight of the droplets may be sufficiently corrected.

APPLICATION EXAMPLE 6

According to another aspect of the invention, there is provided a droplet discharging method using the nozzle discharge quantity correction method, including generating the plurality of different driving waveform signals to be supplied to the actuator of each nozzle based on the results of the correction calculation of the performing of the first correction calculation and the performing of the second correction calculation; and discharging the droplets to the discharge region from the selected nozzle.

According to the Application Example 6, since the total sum A of the weight of all the droplets in the discharge region in the single nozzle array units, in the discharge units, or the scanning units, correction gray scales may be exponentially multiplied to as many as the number of the nozzle array units, discharge units, or scanning units from which the droplets are discharged to the discharge region. That is, the droplet discharging method which can sufficiently correct the variation in the weight of the droplets may be provided.

APPLICATION EXAMPLE 7

According to still another aspect of the invention, there is provided a method of manufacturing an organic Electroluminescent (EL) device which includes a functional layer having an emission layer in a plurality of film formation regions which are partitioned off on a substrate, using the droplet discharging method, the method including discharging liquids, each of which has a functional ingredient, to the plurality of film formation regions; and solidifying the discharged liquids and forming the functional layer.

According to the Application Example 7, a necessary amount of liquid is stably supplied to the film formation region functioning as an application region. Therefore, if the liquid, supplied in the solidification operation, is solidified, a functional layer which has an approximately uniform film thickness can be formed on the respective film formation regions. Therefore, brightness irregularity or emission irregularity attributable to the film thickness irregularity of the functional layer is reduced, so that the organic EL device can be manufactured with excellent yield.

APPLICATION EXAMPLE 8

It is preferable that, in the discharging of the liquid, a plurality of types of liquids which are obtained from different emission colors may be discharged to the desired film formation regions, and, in the solidifying of the discharged liquid, the discharged plurality of types of liquids may be solidified, and the emission layer of at least three colors, that is, red, green, and blue may be formed.

According to the Application Example 8, the organic EL device which can obtain full-colored light emission may be manufactured with excellent yield.

APPLICATION EXAMPLE 9

It is preferable that, in the discharging of the liquid, the plurality of types of liquids to discharge heads which are different from each other may be charged, a correction quantity calculation may be performed for each liquid, and a driving waveform signal may be generated.

According to the Application Example 9, even when the necessary quantity is different from each other for each liquid which is applied to a film formation region, a discharge quantity is appropriately corrected, so that an emission layer having a desired film thickness can be formed.

BRIEF DESCRIPTION OF THE DRAWINGS

The invention will be described with reference to the accompanying drawings, wherein like numbers reference like elements.

FIG. 9 is a view illustrating the data configuration of serial common selection data.

FIG. 10 is a truth table illustrating a method of selecting the first to fourth driving waveform signals of a pre-driving waveform signal and a post-driving waveform signal.

FIG. 11 is a truth table illustrating the classification of the state of a state switching signal.

DESCRIPTION OF EXEMPLARY EMBODIMENTS

Hereinafter, an embodiment of the invention will be described with reference to the drawings. Meanwhile, in order to display each layer and each member at a size which can be recognized, the scales of each layer and each member are displayed in a size which is different from the actual size.
Droplet Discharge Apparatus First, a droplet discharge apparatus capable of discharging liquid, containing a functional ingredient, in the form of droplets to a target material ill be described with reference to FIGS. 1 to 15. The droplet discharge apparatus according to the present embodiment is appropriately used in an organic EL device manufacturing method which will be described later.

Figure 1:
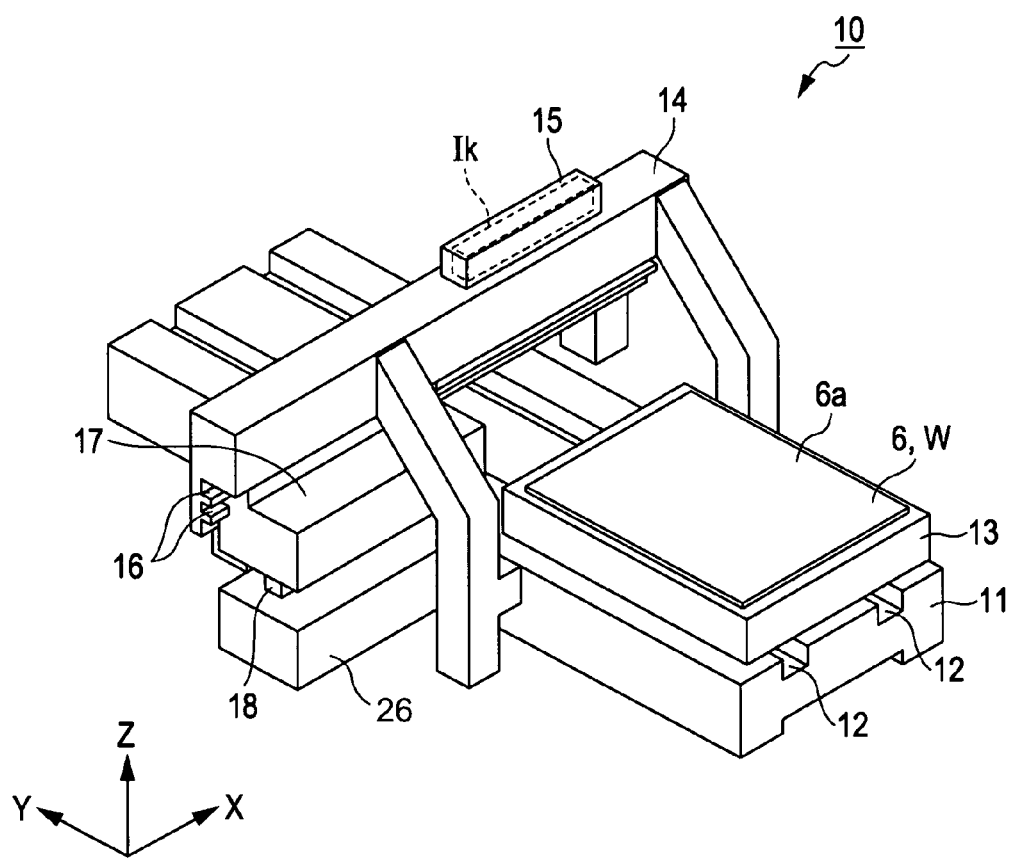
FIG. 1 is a perspective view schematically illustrating the configuration of a droplet discharge apparatus according to an embodiment.

FIG. 1 is a perspective view schematically illustrating the configuration of the droplet discharge apparatus according to the present embodiment.

In FIG. 1, a droplet discharge apparatus 10 includes a base 11 formed in the form of a rectangle. On the upper surface of the base 11, a pair of guide grooves 12, which are extended along the longitudinal direction (Y direction) of the base 11, are formed. A substrate stage 13 is attached on the pair of guide grooves 12. The substrate stage 13 is connected to the output shaft of a stage motor provided in the base 11. The substrate stage 13 is fixedly provided with a substrate 6(W) which functions as a work while a discharge surface 6a is placed on the upper side thereof, and positions and fixes the corresponding substrate 6(W). When the stage motor performs normal rotation or reverse rotation, the substrate stage 13 is scanned along the guide grooves 12 at a predetermined speed, thereby scanning the substrate 6(W) along the Y direction.

On the upper side of the base 11, a guide member 14 which is formed in a gate shape is erected along the X direction which is perpendicular to the Y direction. On the upper side of the guide member 14, an ink tank 15 is provided. The ink tank 15 stores liquid (organic EL ink Ik), containing a functional ingredient, and derives the organic EL ink IK by predetermined pressure.

A pair of vertical guide rails 16, which are extended in the X direction, are formed in the guide member 14. A carriage 17 is attached to the pair of vertical guide rails 16. The carriage 17 is connected to the output shaft of a carriage motor which is provided in the guide member 14. On the bottom side of the carriage 17, a plurality of droplet discharge heads 18 (hereinafter, simply referred to as "discharge head 18") which are arranged in the X direction are provided. When the carriage motor performs normal rotation or reverse rotation, the carriage 17 is scanned along the guide rails 16, thereby scanning each discharge head 18 along the X direction.

Figure 2A:
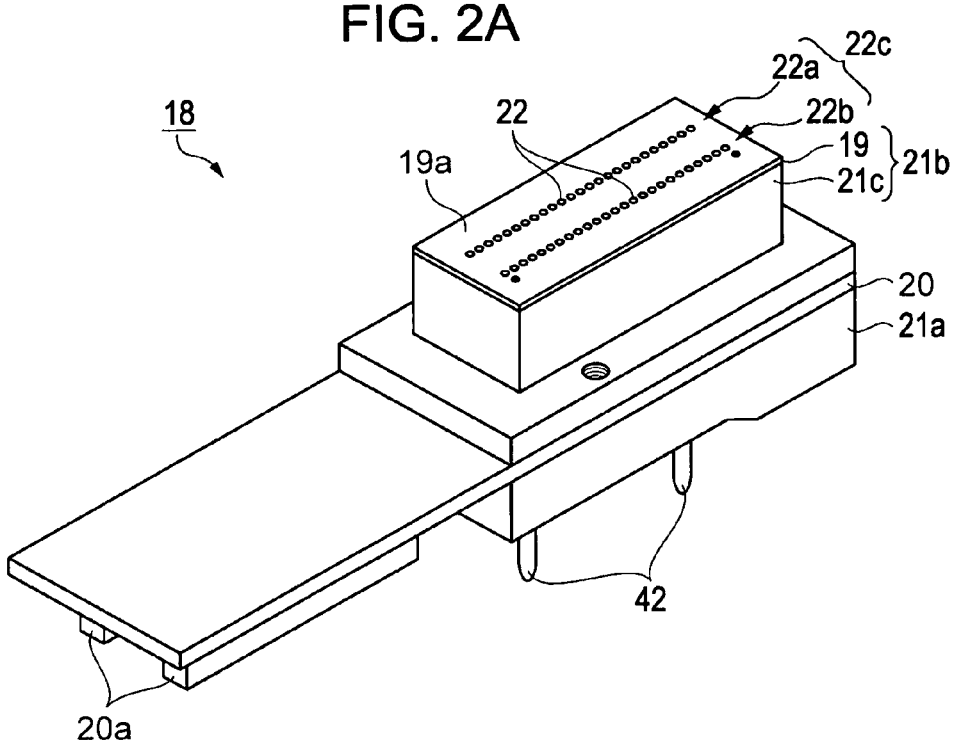
FIG. 2A is a perspective view schematically illustrating the configuration of a discharge head.
Figure 2B:
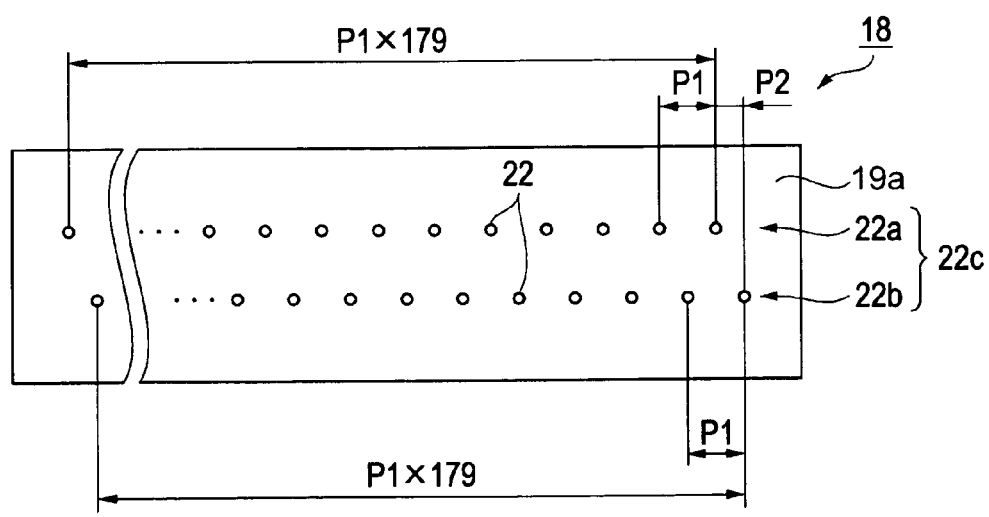
FIG. 2B is a plan view illustrating the state of the arrangement of nozzles.
Figure 3:
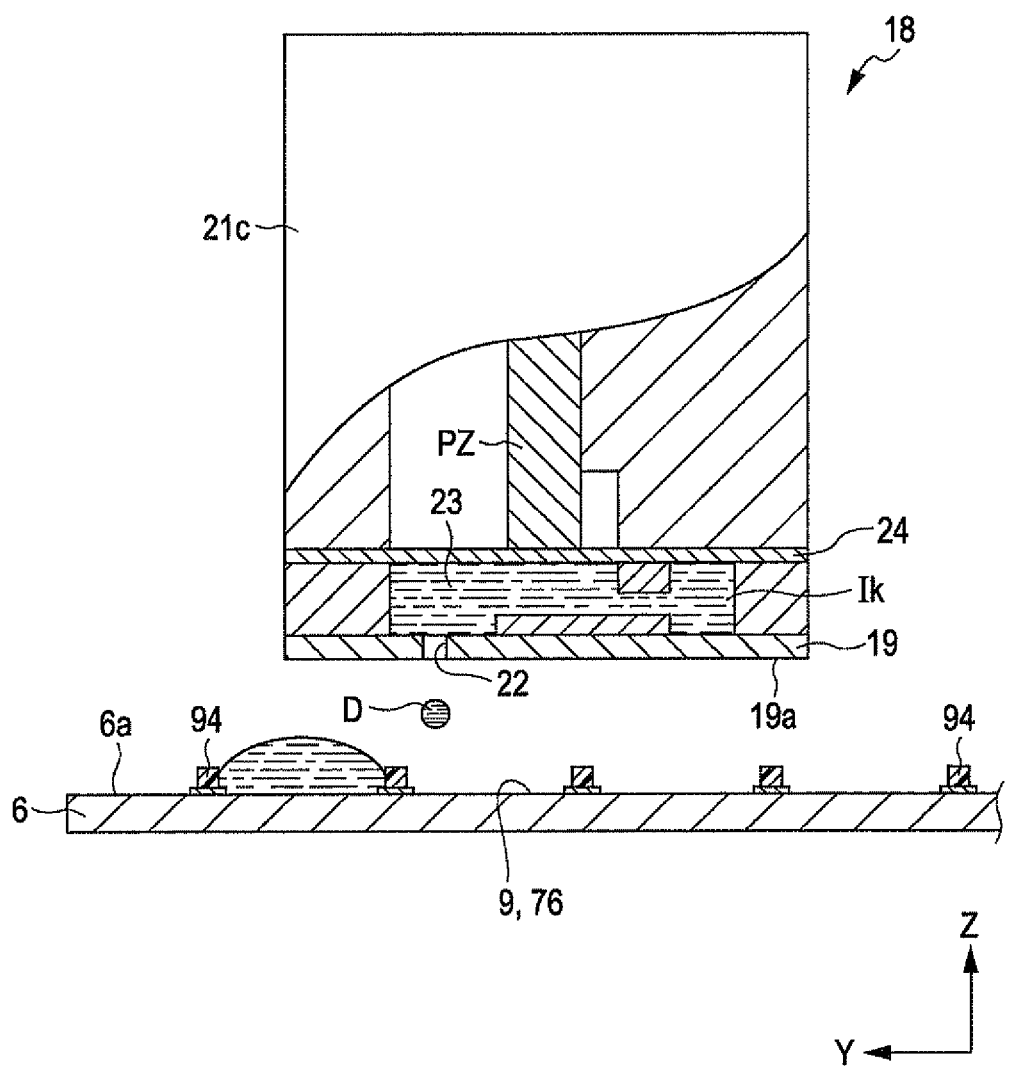
FIG. 3 is a cross-section view schematically illustrating the structure of the discharge head.

FIG. 2A is a perspective view schematically illustrating the configuration of the discharge head, FIG. 2B is a plan view illustrating the state of the arrangement of nozzles, and FIG. 3 is a cross-section view schematically illustrating the structure of the discharge head.

As shown in FIG. 2A, the discharge head 18 is so-called bipartite, and includes an ink (liquid) introduction unit 21a which has a pair of connecting needles 42, a head substrate 20 which is laminated on the introduction unit 21a, and a head body 21b which is arranged on the head substrate 20 and which is formed with a passage (cavity) within the ink (liquid) head.

The connecting needles 42 are connected to the above-described ink tank 15 through pipes, and supplies ink (liquid) to the passage within the head.

In the head substrate 20, a pair of connectors 20a, connected to a head driving circuit 41 (refer to FIG. 4) via a flexible flat cable (not shown), are provided.

The head body 21b includes a pressure section 21c which has cavities configured with piezoelectric elements, and a nozzle plate 19 in which two nozzle arrays 22a and 22b are formed in parallel with each other on a nozzle surface 19a.

As shown in FIG. 2B, a plurality of nozzles (180 nozzles) 22 of each of the two nozzle arrays 22a and 22b are arranged at approximately equal intervals at a pitch P1, and are allocated on the nozzle surface 19a while the plurality of nozzles 22 of each of the two nozzle arrays 22a and 22b are deviated from each other at a pitch P2 which is half of the pitch P1. In this case, the pitch P1 is approximately 141 μm. Therefore, when viewed from a direction which is perpendicular to a nozzle array 22c, 360 nozzles 22 are arranged at a nozzle pitch of approximately 70.5 μm. Further, the radius of the nozzle 22 is approximately 27 μm. Hereinafter, the plurality of nozzles 22 are generically called "nozzle N".

As shown in FIG. 3, a cavity 23 which is in communication with each nozzle N is formed in the pressure section 21c. Each cavity 23 stores ink (liquid) driven by the ink tank 15, and supplies the ink to the corresponding nozzle N. A vibrating plate 24 capable of vibrating in the vertical direction is attached on the upper side of each cavity 23, and enables the volume of the corresponding cavity 23 to be enlarged and reduced. Piezoelectric elements PZ each functioning as an actuator are allocated on the upper side of the vibrating plate 24. When a driving signal (driving waveform signal COM) is applied, each piezoelectric element PZ shrinks and expands in the vertical direction, thereby vibrating the corresponding vibrating plate 24.

When the corresponding vibrating plate 24 vibrates, each cavity 23 vibrates the meniscus of the corresponding nozzle N in the vertical direction, and discharges a predetermined weight of ink (liquid) corresponding to the driving waveform signal COM (driving voltage) from the corresponding nozzle N in the form of a droplet D. The discharged droplet D travels along the approximately normal line of the substrate 6(W), and is deposited on the discharge surface 6a which faces the nozzle N. Barrier units 94, which partition the emission pixels 76 and which will be described later, are provided on the discharge surface 6a, and the droplet D is deposited on a discharge region (application region or film formation region) which is surrounded by the barrier units 94.

In FIG. 1, a droplet weight measurement apparatus 26 is allocated on the left of the base 11. The droplet weight measurement apparatus 26 measures the weight (actual weight Iw) of the droplet D for each nozzle N, and a well-known weight measurement apparatus can be used as the droplet weight measurement apparatus 26. As the droplet weight measurement apparatus 26, for example, an electronic balance which receives the discharged droplet D using a reception tray and then weighs the droplet D can be used. Further, as the droplet weight measurement apparatus 26, an apparatus, which uses a piezoelectric oscillator having an electrode, discharges the droplet D toward the corresponding electrode, and detects the actual weight Iw of the droplet D based on the resonance frequency of the piezoelectric oscillator, the resonance frequency varying depending on the deposition of the droplet D, can be used.

Here, the average value of the actual weight 1w of the respective droplets D discharged from the entire nozzle N in the array is called actual weight average Iwcen. Meanwhile, the actual weight average Iwcen is defined by Iwcen=(Iwmax Iwmin)/2 when the maximum actual weight Iw of the discharged droplet D is expressed as Iwmax and the minimum actual weight Iw thereof is expressed as Iwmin. The actual weight average Iwcen is defined for each of the plurality of discharge heads 18 provided to the carriage 17.

Next, the electrical configuration of the droplet discharge apparatus 10 will be described with reference to FIGS. 4 to 18.

Figure 4:
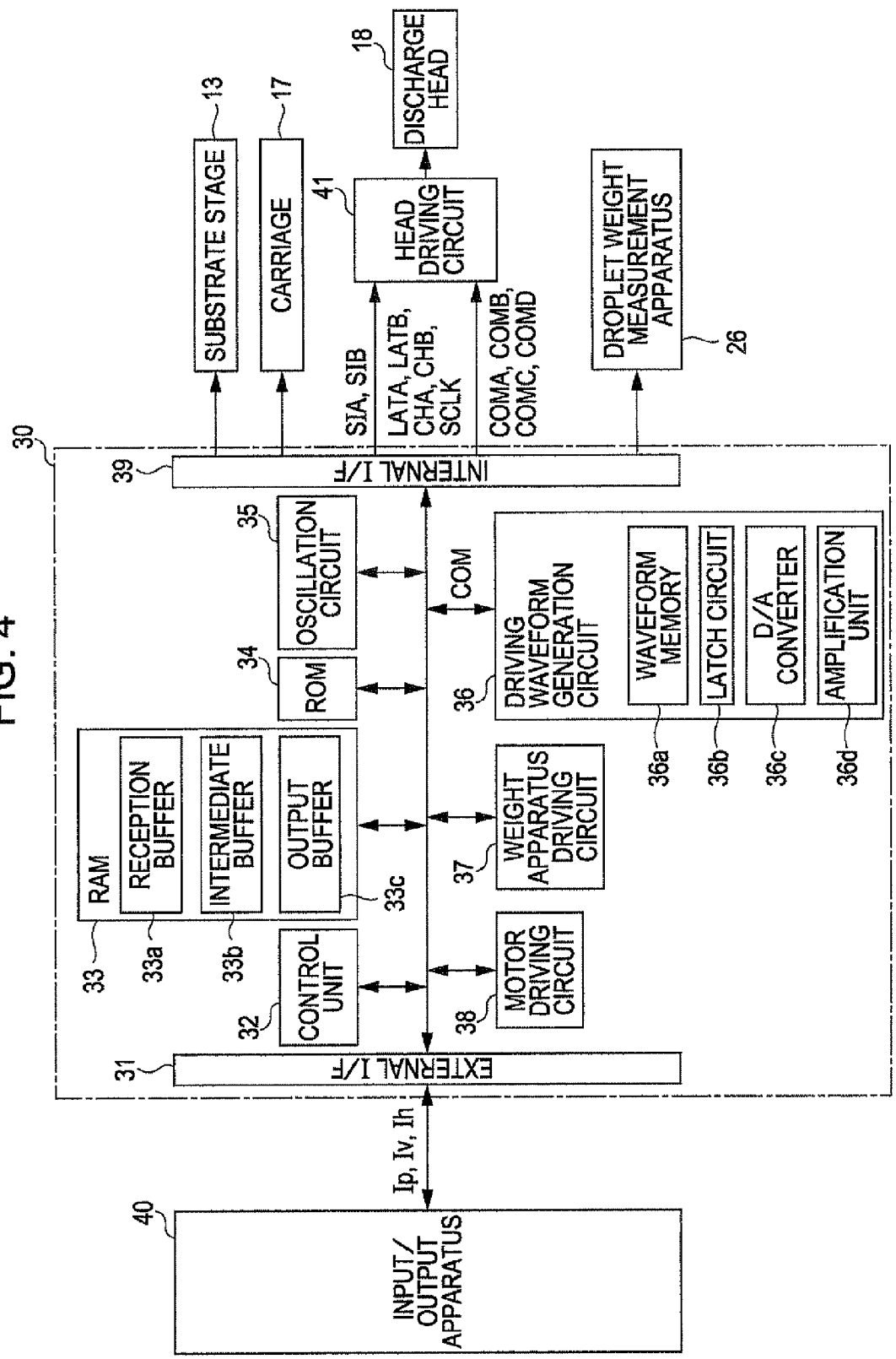
FIG. 4 is a block circuit diagram illustrating the electrical configuration of the droplet discharge apparatus.

FIG. 4 is a block circuit diagram illustrating the electrical configuration of the droplet discharge apparatus.

In FIG. 4, a control apparatus 30 allows the droplet discharge apparatus 10 to execute various types of processes. The control apparatus 30 includes an external interface (I/F) 31, a control unit 32 which includes a Central Processing Unit (CPU), a Random Access Memory (RAM) 33 which has a Dynamic RAM (DRAM) and a Static RAM (SRAM), and functions as a storage section for storing various types of data, and a Read only Memory (ROM) 34 which stores various types of control programs. Further, the control apparatus 30 includes an oscillation circuit 35 which generates a clock signal, a driving waveform generation circuit 36 which functions as a driving waveform signal generation section for generating a driving waveform signal COM, a weight apparatus driving circuit 37 which drives the droplet weight measurement apparatus 26, a motor driving circuit 38 which is used to scan the substrate stage 13 or the carriage 17, an internal I/F 39 which transmits various types of signals. The control apparatus 30 is connected to the input/output apparatus 40 via the external I/F 31. Further, the control apparatus 30 is connected to the substrate stage 13, the carriage 17, the droplet weight measurement apparatus 26, and a plurality of head driving circuits 41 which correspond to the respective discharge heads 18 via the internal I/F 39.

The input/output apparatus 40 is an external computer which includes, for example, a CPU, a RAM, a ROM, a hard disk, a liquid crystal display, and the like. The input/output apparatus 40 outputs various types of control signals, which are used to drive the droplet discharge apparatus 10, to the external I/F 31 based on a control program stored in the ROM or the hard disk. The external I/F 31 receives drawing data Ip, reference driving voltage data Iv and head data Ih, or the like from the input/output apparatus 40.

Here, the drawing data Ip corresponds to various types of data used to discharge the droplet D to each pixel 9 of the discharge surface 6a (refer to FIG. 3), that is, information about the position of the organic EL device or the thickness of a film, information about the discharge position of the droplet D, information about the scanning speed of the substrate stage 13, and the like.

The reference driving voltage data Iv is data related to driving voltage (reference driving voltage $Vh_0$) used to calibrate the actual weight average Iwcen to a predetermined weight (reference weight). The reference driving voltage data Iv is defined for each discharge head 18 because the actual weight average Iwcen of each discharge head 18 is different. That is, the reference driving voltage data Iv is data used to calibrate the actual weight average Iwcen of each discharge head 18 to common reference weight.

The head data Ih is data in which each nozzle N (piezoelectric element PZ) is classified into four ranks, and the rank classification is performed based on the weight of the droplet D discharged from each nozzle. This data is sequentially created by combining the weight of each droplet D for each pair of the nozzle Na of the nozzle array 22a and the nozzle Nb of the nozzle array 22b which discharge the droplet to the same discharge region (sub pixel which corresponds to a film formation region which will be described later).

In FIG. 4, the RAM 33 is used as a reception buffer 33a, an intermediate buffer 33b, and an output buffer 33c.

The ROM 34 stores various types of control routines performed by the control unit 32 and various types of data used to execute the corresponding control routines. The ROM 34 stores, for example, gray scale data used to match gray scale with each dot, and rank data used to match the driving waveform signal COM corresponding to a rank with each nozzle N whenever the gray scale is matched with each dot.

The gray scale data is data used to form a single dot using a plurality of droplets D, and to express multiple tones in a pseudo manner using two gray scales which are used to determine whether to discharge the droplets D or not (that is, discharge or non-discharge).

The rank data is data used to match each of the ranks (1) to (4) with any one of four types which include four different types of driving waveform signal COM (a first driving waveform signal COMA, a second driving waveform signal COMB, a third driving waveform signal COMC, and a fourth driving waveform signal COMD). That is, the rank data is data used to match the driving waveform signal COM with every nozzle N according to the rank.

In FIG. 4, the oscillation circuit 35 generates a clock signal used to synchronize various types of data or various types of driving signals. The oscillation circuit 35 generates, for example, a transmission clock SCLK used when the various types of data are transmitted in series. The oscillation circuit 35 generates a latch signal (a pattern data latch signal LATA or a common selection data latch signal LATE) which is used when parallel conversion is performed on the various types of data transmitted in series. Further, the oscillation circuit 35 generates a state switching signal CHA used to define the discharge timing of the droplet D and a common switching signal CHB used to define the switching timing of the driving waveform signal COM, respectively.

The driving waveform generation circuit 36 includes a waveform memory 36a, a latch circuit 36b, a Digital-to-Analog (D/A) converter 36c, and an amplification unit 36d. The waveform memory 36a stores waveform data used to generate each driving waveform signal COM such that the waveform data corresponds to a predetermined address. The latch circuit 36b latches the waveform data read from the waveform memory by the control unit 32 using a predetermined clock signal. The D/A converter 36c converts the waveform data latched by the latch circuit 36b into an analog signal, and the amplification unit 36d amplifies the analog signal, obtained through the conversion performed by the D/A converter 36c, and generates the driving waveform signal COM at the same time.

When the input/output apparatus 40 inputs the reference driving voltage data Iv, the control unit 32 reads the waveform data of the waveform memory 36a via the driving waveform generation circuit 36 with reference to the reference driving voltage data Iv. Thereafter, the control unit 32 generates four types of driving waveform signals COM (the first driving waveform signal COMA, the second driving waveform signal COMB, the third driving waveform signal COMC, and the fourth driving waveform signal COMD) which are synchronized with a discharge frequency using the driving waveform generation circuit 36.

The control unit 32 generates the first to fourth driving waveform signals COMA, COMB, COMC, and COMD as signals which have different types of driving voltage according to each of the ranks (1) to (4) using the driving waveform generation circuit 36.

Figure 6:
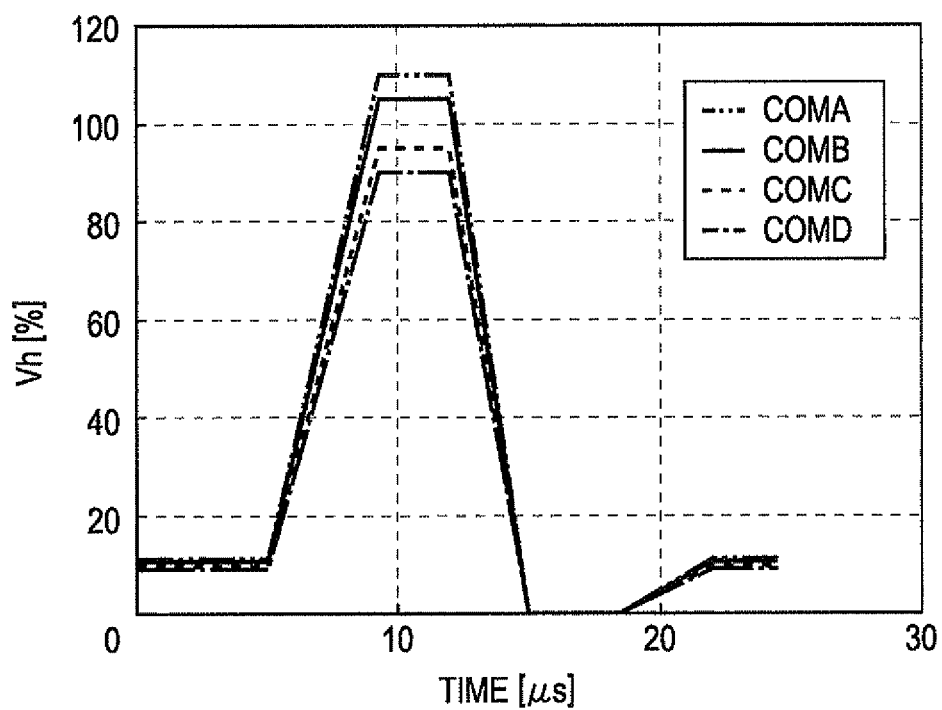
FIG. 6 is a graph illustrating first to fourth driving waveform signals which have different driving voltages.

FIG. 6 is a graph illustrating the first to fourth driving waveform signals which have the different types of driving voltage.

For example, the control unit 32 generates the first driving waveform signal COMA as a signal which has a driving voltage (first driving voltage Vha) according to the nozzle N of the rank (1), as shown in FIG. 6. The first driving voltage Vha is voltage which is at a higher than the reference driving voltage $Vh_0$. Therefore, when the first driving waveform signal COMA, as shown in FIG. 6, is input to the corresponding piezoelectric element PZ, the nozzle N of the rank (1) calibrates the actual weight Iw of the droplet D by increasing the driving quantity (extension quantity) of the corresponding piezoelectric element PZ as much as the first driving voltage Vha, and uses the actual weight 1w of the corresponding droplet D as the actual weight average Iwcen (reference weight).

Likewise, the control unit 32 generates the second driving waveform signal COMB, the third driving waveform signal COMC, and the fourth driving waveform signal COMD, as shown in FIG. 6, using driving voltage (second driving voltage Vhb, third driving voltage Vhc, and fourth driving voltage Vhd) according to the respective rank (2), the rank (3), and the rank (4) using the driving waveform generation circuit 36. When the second driving waveform signal COMB, the third driving waveform signal COMC, and the fourth driving waveform signal COMD are input to the respective corresponding piezoelectric elements PZ, the nozzles N of the rank (2), the rank (3), and the rank (4) calibrate the actual weight Iw of the droplet D based on the driving voltage according to the rank, and uses the actual weight Iw of the corresponding droplet D as the reference weight.

Therefore, when the driving waveform signal COM corresponding to each rank is input, the entire nozzle N (piezoelectric element PZ) can standardize the average value of the actual weight Iw of each droplet D as common reference weight.

In FIG. 4, the control unit 32 outputs a corresponding driving control signal to the weight apparatus driving circuit 37. The weight apparatus driving circuit 37 responds to the driving control signal from the control unit 32, and drives the droplet weight measurement apparatus 26 via the internal I/F 39.

The control unit 32 outputs the corresponding driving control signal to the motor driving circuit 38. The motor driving circuit 38 responds to the driving control signal from the control unit 32, and causes the substrate stage 13 and the carriage 17 to be scanned via the internal I/F 39.

The control unit 32 temporally stores the drawing data Ip received by the external I/F 31 in the reception buffer 33a. The control unit 32 converts the drawing data Ip into intermediate code, and stores the resulting code in the intermediate buffer 33b as intermediate code data. The control unit 32 reads the intermediate code data from the intermediate buffer 33b, deploys the dot pattern data with reference to the gray scale data stored in the ROM 34, and stores the corresponding dot pattern data stored in the output buffer 33c.

The dot pattern data is data used to match each dot gray scale (the pattern of the driving pulse) with the lattice point of dot pattern lattice. The dot pattern data is data in which a 2-bit value ("00", "01", "10", or "11") corresponds to each position (each lattice point of dot pattern lattice) of a 2-Dimensional (2D) drawing plane (discharge surface 6a). Meanwhile, the dot pattern lattice is a lattice with a minimum interval in which the dot gray scale is defined.

When a single scan of the dot pattern data of the substrate stage 13 is deployed, the control unit 32 generates serial data which is synchronized with the transmission clock SCLK using the corresponding dot pattern data, and transmits the corresponding serial data to the head driving circuit 41 in series via the internal I/F 39. When the single scan of the dot pattern data is transmitted in series, the control unit 32 removes the content of the intermediate buffer 33b, and performs a deployment process on subsequent intermediate code data.

Here, the serial data generated using the dot pattern data is called serial pattern data SIA. The serial pattern data SIA is generated in units of the lattice of the dot pattern lattice along the scanning direction.

Figure 7:
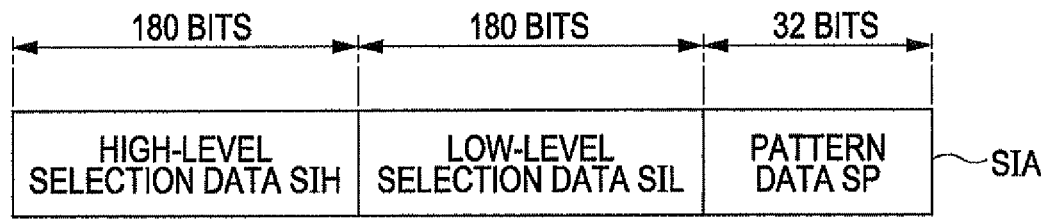
FIG. 7 is a view illustrating the data configuration of serial pattern data.

FIG. 7 is a view illustrating the data configuration of the serial pattern data SIA.

As shown in FIG. 7, the serial pattern data SIA includes 2-bit values corresponding to the number of nozzles N (180) in order to select the gray scale of a dot. The serial pattern data SIA includes 180-bit higher-level selection data SIH which includes higher-order bits of the 2-bit values used to select the dot gray scale, and 180-bit lower-level selection data SIL which includes lower-order bits. Further, the serial pattern data SIA includes pattern data SP in addition to the higher-level selection data SIH and the lower-level selection data SIL.

The pattern data SP is data which includes 32 bits obtained by matching 8-bit data (each switch data Pnm (nm=00 to 03, 10 to 13, . . . 70 to 73) into each of 4 values defined using the higher-level selection data SIH and the lower-level selection data SIL. Each switch data Pnm (nm=00 to 03, 10 to 13, . . . , 70 to 73) is data used to define the on and off state of each of the piezoelectric elements PZ.

Figure 8:
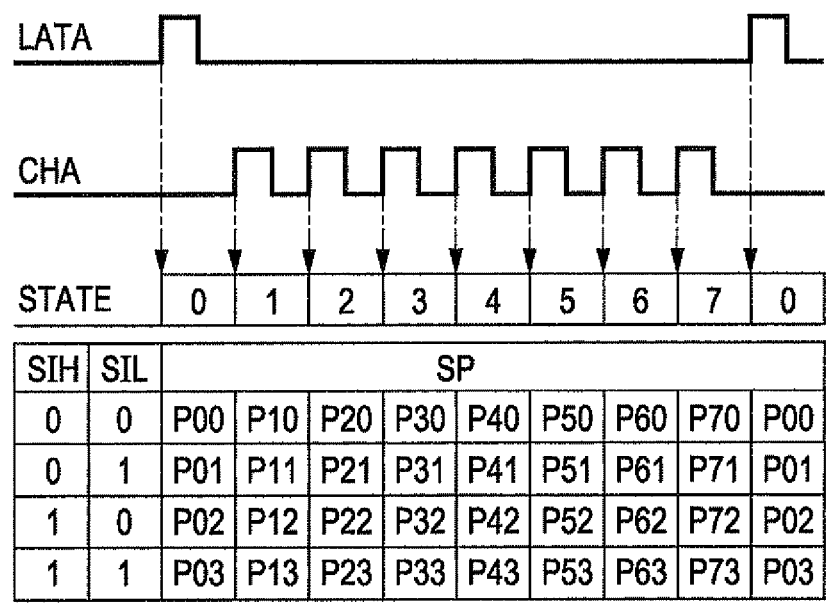
FIG. 8 is a truth table illustrating the classification of the state of a state switching signal.

FIG. 8 is a truth table illustrating the classification of the state of the state switching signal CHA.

As shown in FIG. 8, the state switching signal CHA is a pulse signal generated using the discharge frequency of the droplet D. Here, the condition which is defined for each pulse of the state switching signal CHA is called a "state". The state switching signal CHA divides the state between the generation of a previous pattern data latch signal LATA and the generation of a successive pattern data latch signal LATA into a plurality of states (for example, the respective states of (0) to (7)). Meanwhile, the period between the generation of the previous pattern data latch signal LATA and the generation of the successive pattern data latch signal LATA corresponds to a period that each nozzle N faces the unit lattice of the dot pattern lattice.

The control unit 32 matches each data (each switch data Pnm) of the pattern data SP with each state based on the truth table shown in FIG. 8 using the head driving circuit 41. For example, the control unit 32 matches switch data P00, P10, . . . , and P70 with the nozzle N (piezoelectric element PZ) which has a higher-level selection data SIH of "0" and a lower-level selection data SIL of "0" using the head driving circuit 41. The control unit 32 matches the switch data P00, P10, . . . , and P70 with the respective states of (0) to (7). Thereafter, the control unit 32 supplies the driving waveform signal COM to the corresponding piezoelectric element PZ at the state, in which the switch data P00 to P70 are set to "1", using the head driving circuit 41. For example, when P00 to P60 are "0" and P70 are "1", the control unit 32 turns off the piezoelectric element PZ during the state of (0) to (6), and turns on the corresponding piezoelectric element PZ at the timing that the state becomes (7).

Likewise, the control unit 32 matches the respective switch data P01 to P71, P02 to P72, and P03 to P73 with the nozzle N (piezoelectric element PZ) in which the higher-level selection data SIH and the lower-level selection data SIL are "01", "10", and "11" according to the truth table shown in FIG. 8. The control unit 32 matches the switch data P01 to P71, P02 to P72, and P03 to P73 to the respective states of (0) to (7). Thereafter, the control unit 32 supplies the driving waveform signal COM to the corresponding piezoelectric element PZ using the head driving circuit 41 at the state in which the switch data P01 to P71, P02 to P72, and P03 to P73 are "1".

Therefore, whenever each serial pattern data SIA is generated, the entire nozzle N implements the dot gray scale (that is, the pattern of the driving pulse) selected using the corresponding higher-level selection data SIH and lower-level selection data SIL with respect to the corresponding lattice at the given time.

In FIG. 4, the control unit 32 temporally stores the head data Ih, received by the external I/F 31, in the reception buffer 33a. The control unit 32 converts the head data Ih into the intermediate code, and stores the resulting code in the intermediate buffer 33b as the intermediate code data. The control unit 32 reads the intermediate code data from the intermediate buffer 33b, deploys the intermediate code data to common selection data with reference to the rank data stored in the ROM 34, and stores the corresponding common selection data in the output buffer 33c.

The common selection data is data used to match each 2-bit value ("00", "01", "10", and "11") with each lattice dot of the dot pattern lattice, and is data used to match any one of the first to fourth driving waveform signals COMA, COMB, COMC, and COMA with each of the four values.

When a signal scan of the common selection data of the substrate stage 13 is received, the control unit 32 generates serial data which is synchronized with a transmission clock SCLK using the common selection data, and then transmits the corresponding serial data to the head driving circuit 41 in series via the internal I/F 39. When the single scan of the common selection data is transmitted in series, the control unit 32 removes the content of the intermediate buffer and then performs the deployment process on subsequent intermediate code data.

Here, the serial data generated using the common selection data is called serial common selection data SIB. The serial common selection data SIB is generated in units of the lattice of the dot pattern lattice along the scanning direction like the serial pattern data SIA.

FIG. 9 is a view illustrating the data configuration of the serial common selection data SIB. FIG. 10 is a truth table illustrating a method of selecting the first to fourth driving waveform signals of a pre-driving waveform signal COMF and a post-driving waveform signal COML.

As shown in FIG. 9, the serial common selection data SIB includes pre-serial common selection data SFB used to define the type of the pre-driving waveform signal COMF and the post-serial common selection data SLB used to define the type of the post-driving waveform signal COML.

The pre-serial common selection data SFB includes 180-bit pre-higher-level selection data SFH which includes the higher-order bits of the 2-bit value used to define the type of the pre-driving waveform signal COMF and the 180-bit pre-lower-level selection data SFL which includes lower-order bits. Further, the pre-serial common selection data SFB includes 32-bit control data CR in addition to the pre-higher-level selection data SFH and the pre-lower-level selection data SFL.

The pre-higher-level selection data SFH and the pre-lower-level selection data SFL are data used to match the type of each driving waveform signal COM with each nozzle N (piezoelectric element PZ) according to the truth table shown in FIG. 10.

The control unit 32 matches the type of each driving waveform signal COM with each of the 180 nozzles N (piezoelectric elements PZ) using the pre-higher-level selection data SFH and the pre-lower-level selection data SFL via the head driving circuit 41 according to the truth table shown in FIG. 10. For example, the control unit 32 matches each first driving waveform signal COMA with the nozzle N (piezoelectric element PZ) in which the pre-higher-level selection data SFH is "0" and the pre-lower-level selection data SFL "0" using the head driving circuit 41. The control unit 32 matches the second driving waveform signal COMB, the third driving waveform signal COMC, and the fourth driving waveform signal COMD, respectively, with the nozzles N (piezoelectric elements PZ) in which the pre-higher-level selection data SFH and the pre-lower-level selection data SFL are "01", "10", and "11".

The control data CR includes data used to drive a temperature detection circuit provided in the head driving circuit 41. Further, the control data CR includes 1-bit latch selection data AD. The latch selection data AD is data used to cause each latch to determine whether to latch the pre-higher-level selection data SFH and the pre-lower-level selection data SFL according to each bit value ("1" or "0"). When the latch selection data AD is "0", the control unit 32 causes a latch for the pre-driving waveform signal COMF to latch the pre-higher-level selection data SFH and pre-lower-level selection data SFL using the head driving circuit 41.

The post-serial common selection data SLB includes 180-bit post-higher-level selection data SLH which includes higher-order bits of the 2-bit value used to define the type of the post-driving waveform signal COML, and 180-bit post-lower-level selection data SLL which includes lower-order bits. The post-serial common selection data SLB includes 32-bit dummy data DM in addition to the post-higher-level selection data SLH and the post-lower-level selection data SLL.

The post-higher-level selection data SLH and post-lower-level selection data SLL is data used to match the type of each driving waveform signal COM with each nozzle N (piezoelectric element PZ) according to the truth table shown in FIG. 10. The control unit 32 matches the type of each driving waveform signal COM with each of the 180 nozzles N (piezoelectric elements PZ) using the post-higher-level selection data SLH and the post-lower-level selection data SLL via the head driving circuit 41 according to the truth table shown in FIG. 10. For example, the control unit 32 matches each first driving waveform signal COMA with the nozzle N (piezoelectric element PZ) in which the post-higher-level selection data SLH is "0" and the post-lower-level selection data SLL is "0" using the head driving circuit 41. The control unit 32 matches the second driving waveform signal COMB, the third driving waveform signal COMC, and the fourth driving waveform signal COMD, respectively, with the nozzles N (piezoelectric elements PZ) in which the post-higher-level selection data SLH and the post-lower-level selection data SLL are "01", "10", and "11".

Meanwhile, a state in which the driving waveform signal COM which is supplied to each piezoelectric element PZ is selected based on the pre-higher-level selection data SFH and the pre-lower-level selection data SFL is called pre-selection. Further, a state in which the driving waveform signal COM which is supplied to each piezoelectric element PZ is selected based on the post-higher-level selection data SLH and the post-lower-level selection data SLL is called post-selection.

The dummy data DM is data used to transmit the corresponding post-serial common selection data SLB using the transmission clock SCLK which is the same as that of the serial pattern data SIA. The dummy data DM includes the latch selection data AD in addition to data which becomes null.

When the bit value of the latch selection data AD is "1", the control unit 32 causes the latch for the post-driving waveform signal COML to latch the post-higher-level selection data SLH and the post-lower-level selection data SLL using the head driving circuit 41.

FIG. 11 is a truth table illustrating the classification of the states of a state switching signal CHB.

As shown in FIG. 11, the common switching signal CHB is a signal used to switch the selection state (the common selection data state: "F" or "L") of the driving waveform signal COM which is supplied to each piezoelectric element PZ. That is, the common switching signal CHB is a signal used to switch the pre-selection (in the state in which the common selection data state is "F") to the post-selection (in the state in which the common selection data state is "L").

The common selection data state switches to "F" (pre-selection) or "L" (post-selection) in synchronization with the rise of the common switching signal CHB. The common selection data state is initialized to the "F" state (pre-selection) when the pattern data latch signal LATA is at the "H" level (high potential level) and the common switching signal CHB is at the "L" level. The common selection data state is set to the "L" state (post-selection) when the pattern data latch signal LATA is at the "H" level and the common switching signal CHB is at the "H" level.

Figure 12:
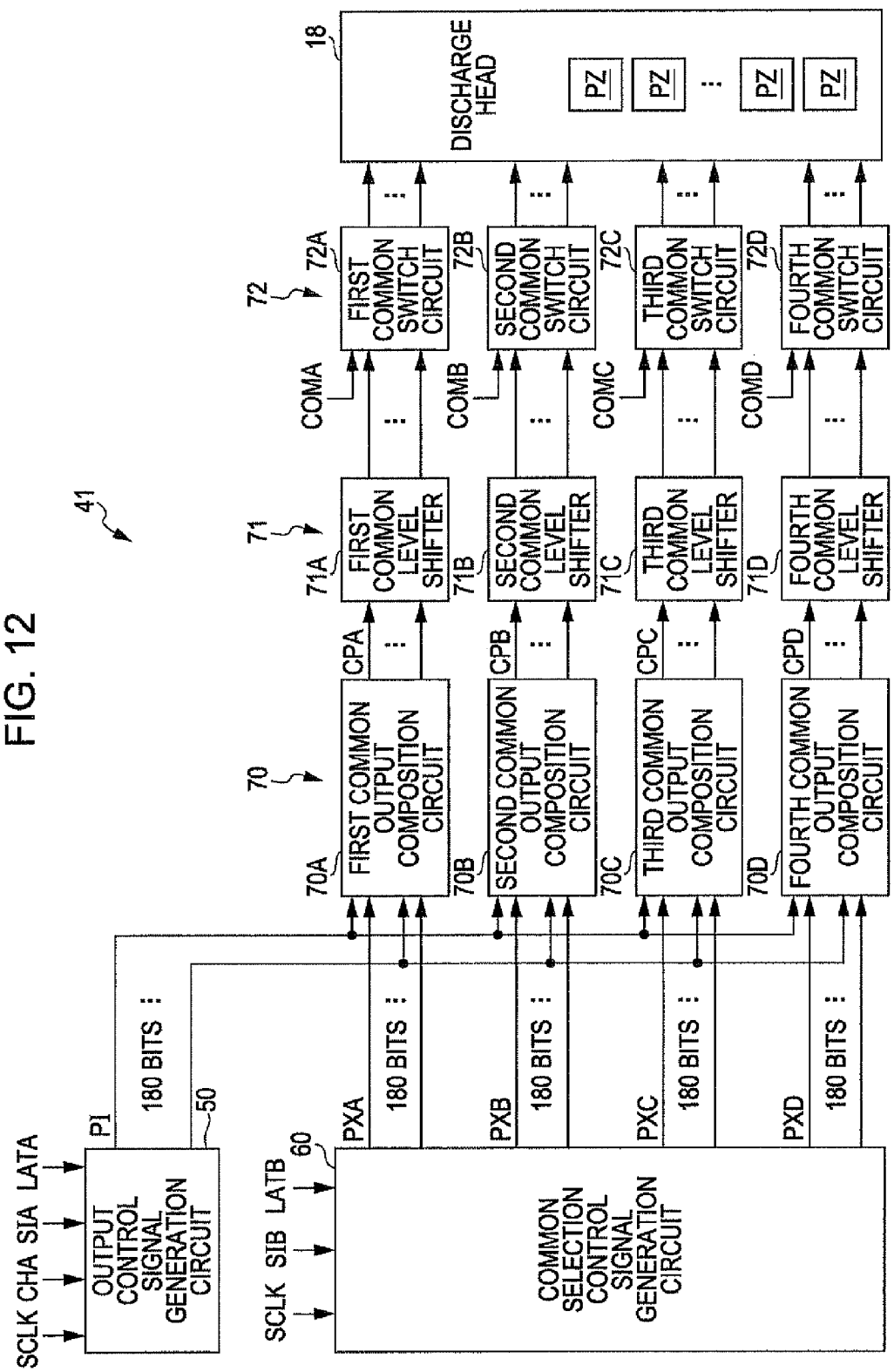
FIG. 12 is a block diagram illustrating the configuration of a head driving circuit.

Next, the head driving circuit 41 will be described with reference to FIG. 12. FIG. 12 is a block diagram illustrating the configuration of the head driving circuit.

As shown in FIG. 12, the head driving circuit 41 includes an output control signal generation circuit 50 which functions as an output control signal generation section, and a common selection control signal generation circuit 60 which functions as a common selection data control signal generation section. Further, the head driving circuit 41 includes an output composition circuit 70 (first to fourth common output composition circuits 70A, 70B, 70C, and 70D) and a level shifter 71 (first to fourth common level shifters 71A, 71B, 71C, and 71D) which boosts the signal of a logic system into the driving voltage level of the analog switch. Further, the head driving circuit 41 includes a four-system switch circuit 72 (first to fourth common switch circuits 72A, 72B, 72C, and 72D) which includes an analog switch used to supply each driving waveform signal COM to the piezoelectric element PZ. An output section is configured using the output composition circuit 70, the level shifter 71, and the switch circuit 72.

Figure 13:
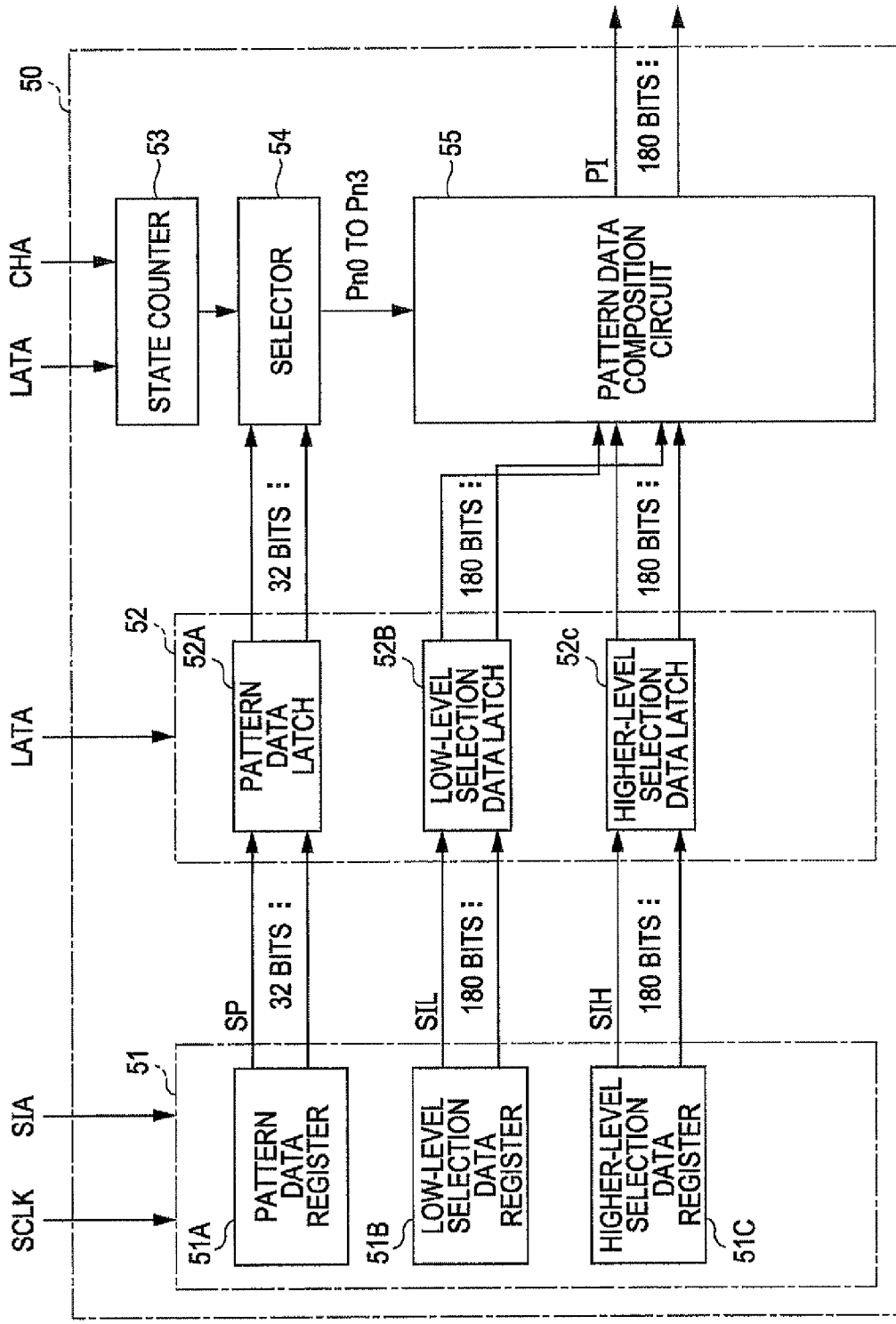
FIG. 13 is a block diagram illustrating the configuration of an output control signal circuit.

First, the output control signal generation circuit 50 which is used to generate an output control signal PI will be described below. FIG. 13 is a block diagram illustrating the configuration of the output control signal circuit.

As shown in FIG. 13, the output control signal generation circuit 50 includes a shift register 51, a latch 52, a state counter 53, a selector 54, and a pattern data combination circuit 55.

The shift register 51 includes a pattern data register 51A, a lower-level selection data register 513, and a higher-level selection data register 51C. The serial pattern data STA and the transmission clock SCLK are input to the shift register 51 from the control apparatus 30.

The pattern data register 51A stores 32-bit pattern data SP in such a way that the pattern data SP of the serial pattern data STA is received in series and sequentially shifted based on the transmission clock SCLK. The lower-level selection data register 51B stores 180-bit lower-level selection data SIL in such a way that the lower-level selection data SIL of the serial pattern data SIA is received in series and sequentially shifted based on the transmission clock SCLK. The higher-level selection data register 51C stores 180-bit higher-level selection data SIH in such a way that the higher-level selection data SIH of the serial pattern data STA is received in series and sequentially shifted based on the transmission clock SCLK.

The latch 52 includes a pattern data latch 52A, a lower-level selection data latch 523, and a higher-level selection data latch 52C. The pattern data latch signal LATA is input to the latch 52 from the control apparatus 30.

When the pattern data latch signal LATA is input, the pattern data latch 52A latches the data of the pattern data register 51A, that is, the pattern data SP. When the pattern data latch signal LATA is input, the lower-level selection data latch 52B latches the data of the lower-level selection data register 518, that is, the lower-level selection data SIL. When the pattern data latch signal LATA is input, the higher-level selection data latch 52C latches the data of the higher-level selection data register 51C, that is, the higher-level selection data SIH.

The state counter 53 is a 3-bit counter circuit, counts at the rising edge of the state switching signal CHA, and changes the state. The state counter 53 counts the state from (0) to (7), and then returns the state to (0) when the state switching signal CHA is input. Further, the state counter 53 is reset when the LATA signal is at the "H" level (high potential level), and then returns the state to "0". When the state switching signal CHA and the pattern data latch signal LATA are input from the control apparatus 30, the state counter 53 counts the value of the state and then output the value to the selector 54.

The selector 54 selects the switch data Pn0 to Pn3 corresponding to the value of the state based on the value of the state output by the state counter 53 and the pattern data SP latched by the pattern data latch 52A at any given time, and then outputs the selected switch data Pn0 to Pn3 to the pattern data combination circuit 55. That is, when the pattern data latch signal LATA is input to the pattern data latch 52A, the selector 54 reads the pattern data SP latched by the pattern data latch 52A, and selects the switch data Pn0 to Pn3 corresponding to the value of the state (n) according to the truth table shown in FIG. 8. For example, when the state of the state counter 53 is "0", the selector 54 outputs the pattern data SP according to the state (0), that is, the switch data P00 to P03 shown in FIG. 8, to the pattern data combination circuit 55.

When each switch data Pn0 to Pn3 is input from the selector 54, the pattern data combination circuit 55 reads the lower-level selection data SIL latched by the lower-level selection data latch 523 and the higher-level selection data SIH latched by the higher-level selection data latch 52C. The pattern data combination circuit 55 generates 180-bit data (output control signal PI) which defines the discharge and non-discharge (each bit value: "0" or "1") of droplets with respect to the 180 nozzles N for each state using each switch data Pn0 to Pn3, the lower-level selection data SIL, and the higher-level selection data SIH according to the truth table shown in FIG. 8.

Figure 14:
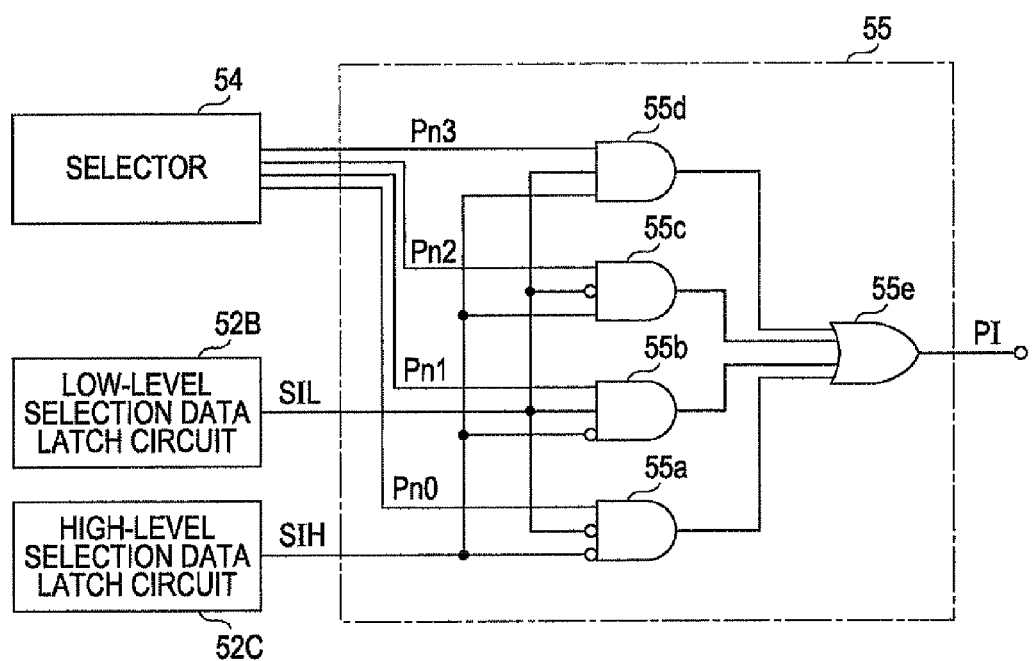
FIG. 14 is a block diagram illustrating the configuration of a pattern data combination circuit.

FIG. 14 is a block diagram illustrating the configuration of the pattern data combination circuit.

As shown in FIG. 14, the pattern data combination circuit 55 includes four AND gates 55a, 55b, 55c, and 55d which correspond to, for example, a single nozzle N, and an OR gate 55e to which the outputs of the AND gates 55a, 55b, 55c, and 55d are input. The higher-level selection data SIH, the lower-level selection data SIL, and the corresponding switch data Pn0 to Pn3 are input to each of the AND gates 55a, 55b, 55c, and 55d. When the higher-level selection data SIH and the lower-level selection data SIL are "00", only the AND gate 55a is available, so that the switch data Pn0 ("0" or "1") is output as the output control signal␣P1 of the corresponding nozzle N. Further, when the higher-level selection data SIH and the lower-level selection data SIL are "01", "10", or "11", only each AND gate 55b, 55c, or 55d is available, so that the switch data Pn1, Pn2, or Pn3 ("0" or "1") is output as the output control signal PI of the corresponding nozzle N. Therefore, the switch data Pnm corresponding to the truth table shown in FIG. 8 is output as the output control signal PI.

Next, the common selection control signal generation circuit 60 which is used to generate each of the common selection data control signals PXA, PXB, PXC, and PXD will be described.

Figure 15:
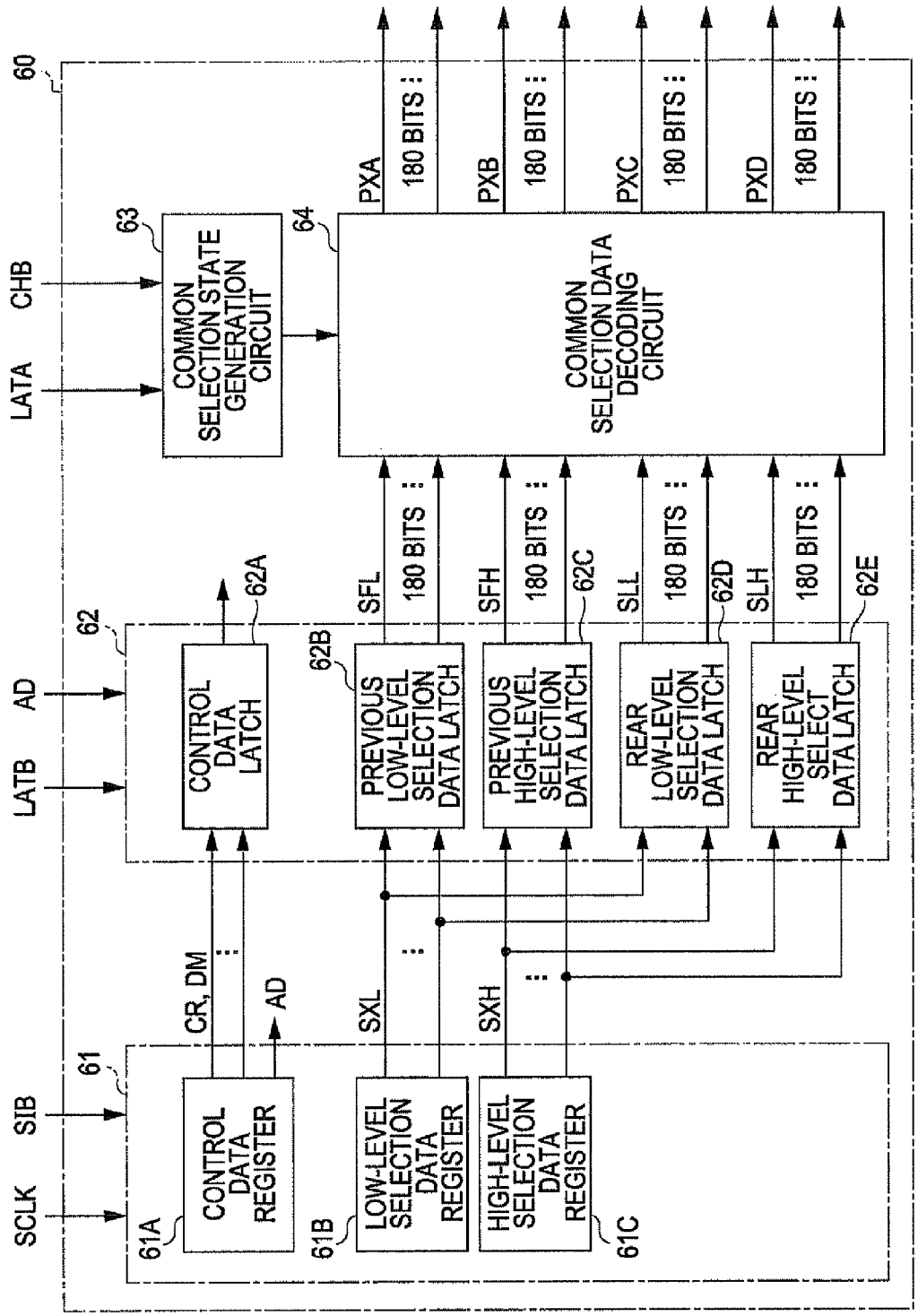
FIG. 15 is a block diagram illustrating the configuration of a common selection control signal generation circuit.

FIG. 15 is a block diagram illustrating the configuration of the common selection control signal generation circuit.

As shown in FIG. 15, the common selection control signal generation circuit 60 includes a shift register 61, a latch 62, a common selection data state generation circuit 63, and a common selection data decoding circuit 64.

The shift register 61 includes a control data register 61A, a lower-level selection data register 61B, and a higher-level selection data register 61C. The serial common selection data SIB and the transmission clock SCLK are input to the shift register 61 from the control apparatus 30.

The control data register 61A stores the 32-bit control data CR in such a way that the control data CR of the serial common selection data SIB is transmitted in series, and then sequentially shifted based on the transmission clock SCLK. Otherwise, the control data register 61A stores the 32-bit dummy data DM in such a way that the dummy data DM of the serial common selection data SIB is transmitted in series, and then sequentially shifted based on the transmission clock SCLK.

The lower-level selection data register 61B stores the 180-bit lower-level selection data SXL in such a way that the lower-level selection data SXL (the pre-lower-level selection data SFL or the post-lower-level selection data SLL) of the serial common selection data SIB is transmitted in series, and then sequentially shifted based on the transmission clock SCLK. The higher-level selection data register 61C stores the 180-bit higher-level selection data SXH in such a way that the higher-level selection data SXH (the pre-higher-level selection data SFH or the post-higher-level selection data SLH) of the serial common selection data SIB is transmitted in series, and then sequentially shifted based on the transmission clock SCLK.

The latch 62 includes a control data latch 62A, a pre-lower-level selection data latch 62B, a pre-higher-level selection data latch 62C, a post-lower-level selection data latch 62D, and a post-higher-level selection data latch 62E. The common selection data latch signal LATB and the latch selection data AD are input to the latch 62 from the control apparatus 30.

When the common selection data latch signal LATB is input, the control data latch 62A latches the data of the control data register 61A, that is, the control data CR or the dummy data DM, and then outputs the latched data to a predetermined control circuit (for example, a temperature detection circuit or the like).

When the common selection data latch signal LATE is input, the pre-lower-level selection data latch 62B reads the latch selection data AD stored in the control data register 61A. When the corresponding latch selection data AD is "0", the pre-lower-level selection data latch 62B latches the data of the lower-level selection data register 61B, that is, the pre-lower-level selection data SFL. Further, when the common selection data latch signal LATE is input, the pre-higher-level selection data latch 62C reads the latch selection data AD stored in the control data register 61A. When the corresponding latch selection data AD is "1", the pre-higher-level selection data latch 62C latches the data of the higher-level selection data register 61C, that is, the pre-lower-level selection data SFL.

When the selection data latch signal LATB is input, the post-lower-level selection data latch 62D reads the latch selection data AD stored in the common control data register 61A. When the corresponding latch selection data AD is "1", the post-lower-level selection data latch 62D latches the data of the lower-level selection data register 61B, that is, the post-lower-level selection data SLL. Further, when the selection data latch signal LATB is input, the post-higher-level selection data latch 62E reads the latch selection data AD stored in the control data register 61A. When the corresponding latch selection data AD is "0", the post-higher-level selection data latch 62E latches the data of the higher-level selection data register 61C, that is, the post-lower-level selection data SLL.

The common selection data state generation circuit 63 is a 1-bit counter circuit, and counts at the rising edge of the common switching signal CHB. The common selection data state generation circuit 63 switches the common selection data state to "F" (pre-selection) or "L" (post-selection) according to the state of the common switching signal CHB and the state of the pattern data latch signal LATA as shown in FIG. 11, and outputs a signal relevant to the common selection data state to the common selection data decoding circuit 64.

When the common selection data state is "F", the common selection data decoding circuit 64 reads the pre-lower-level selection data SFL which is latched by the pre-lower-level selection data latch 62B and the pre-higher-level selection data SFH which is latched by the pre-higher-level selection data latch 62C. The common selection data decoding circuit 64 determines whether to use each of four different driving waveform signals COM (selection and non-selection) using the pre-lower-level selection data SFL and the pre-higher-level selection data SFH according to the truth table, shown in FIG. 10. The common selection data decoding circuit 64 generates data which defines the selection and non-selection of each driving waveform signal COM with respect to each of the 180 nozzles N.

Further, when the common selection data state is "L", the common selection data decoding circuit 64 reads the post-lower-level selection data SLL which is latched by the post-lower-level selection data latch 62D and the post-higher-level selection data SLH which is latched by the post-higher-level selection data latch 62E. The common selection data decoding circuit 64 determines whether to use each of the four different driving waveform signals COM (selection and non-selection) using the post-lower-level selection data SLL and the post-higher-level selection data SLH according to the truth table shown in FIG. 10. The common selection data decoding circuit 64 generates data which defines the selection and non-selection of each driving waveform signal COM with respect to each of the 180 nozzles N.

That is, when the common selection data state is "F", the common selection data decoding circuit 64 generates data which defines any one of the pre-driving waveform signals COMF with respect to each of the 180 nozzles N. When the common selection data state is "L", the common selection data decoding circuit 64 generates data which defines any one of the post-driving waveform signals COML with respect to each of the 180 nozzles N.

Here, data which defines the selection and non-selection of the first driving waveform signal COMA is called the first common selection data control signal PXA. Further, data which defines the selection and non-selection of the second driving waveform signal COMB, data which defines the selection and non-selection of the third driving waveform signal COMC and data which defines the selection and non-selection of the fourth driving waveform signal COMD are respectively called the second common selection data control signal PXB, the third common selection data control signal PXC, and the fourth common selection data control signal PXD.

In FIG. 12, the output composition circuit 70 includes the first common output composition circuit 70A, the second common output composition circuit 70B, the third common output composition circuit 70C, and the fourth common output composition circuit 70D. The 180-bit output control signal PI is commonly input to each of the output composition circuits 70A, 70B, 70C, and 70D from the output control signal generation circuit 50. Further, the first common selection data control signal PXA, the second common selection data control signal PXB, the third common selection data control signal PXC, and the fourth common selection data control signal PXD are input to the respective output composition circuits 70A, 70B, 70C, and 70D from the common selection control signal generation circuit 60.

Each of the first to fourth common output composition circuits 70A, 70B, 70C, and 70D includes AND gates each of which corresponds to a single nozzle N. The corresponding output control signal PI and the corresponding first common selection data control signals PXA are input to each AND gate of the first common output composition circuit 70A. Each AND gate of the first common output composition circuit 70A outputs a signal (a first selection common output control signal CPA) used to define whether to supply the first driving waveform signal COMA to each corresponding piezoelectric element PZ (supply or non-supply). The corresponding output control signal PI and the corresponding second common selection data control signal PXB are input to each AND gate of the second common output composition circuit 70B. Each AND gate of the second common output composition circuit 70B outputs a signal (a second selection common output control signal CPB) used to define the supply or non-supply of the second driving waveform signal COMB to each corresponding piezoelectric element PZ. The corresponding output control signal PI and the corresponding third common selection data control signal PXC are input to each AND gate of the third common output composition circuit 70C. Each AND gate of the third common output composition circuit 70C outputs a signal (a third selection common output control signal CPC) used to define the supply or non-supply of the third driving waveform signal COMC to each corresponding piezoelectric element PZ. Further, the corresponding output control signal PI and the corresponding fourth common selection data control signal PXD are input to each AND gate of the fourth common output composition circuit 70D. Each AND gate of the fourth common output composition circuit 70D outputs a signal (a fourth common selection data control signals CPD) used to define the supply or non-supply of the fourth driving waveform signal COMD to each corresponding piezoelectric element PZ.

For example, when the output control signal PI is "1" and the first common selection data control signals PXA is "1", the first common output composition circuit 70A outputs the first selection common output control signal CPA (the signal in which a bit value is "1") used to supply the first driving waveform signal COMA to the corresponding piezoelectric element PZ. In contrast, when the output control signal PI is "0" or the first common selection data control signal PXA is "0", the first common output composition circuit 70A outputs the first selection common output control signal CPA (the signal in which a bit value is "0") used to prevent the first driving waveform signal COMA from being supplied to the corresponding piezoelectric element PZ.

Therefore, the discharge or non-discharge of the droplet D with respect to each of the 180 nozzles N (piezoelectric elements PZ) is determined based on the output control signal PI, and the supply or non-supply of each driving waveform signal COM is determined based on the first to fourth common selection data control signals PXA, PXB, PXC, and PXD.

The level shifter 71 includes four system level shifters (the first common level shifter 71A, the second common level shifter 71B, the third common level shifter 71C, and the fourth common level shifter 71D) for the first to fourth driving waveform signals COMA, COMB, COMC, and COMD. The first to fourth selection common output control signals CPA, CPB, CPC, and CPD are input to the respective first to fourth common level shifters 71A, 71B, 71C, and 71D from the respective corresponding output composition circuit 70. The first to fourth common level shifters 71A, 71B, 71C, and 71D boost the respective first to fourth selection common output control signals CPA, CPB, CPC, and CPD to the driving voltage levels of analog switches, and then output corresponding switching signals to the 180 piezoelectric elements PZ.

The switch circuit 72 includes four system switch circuits (the first common switch circuit 72A, the second common switch circuit 72B, the third common switch circuit 72C, and the fourth common switch circuit 72D) for the first to fourth driving waveform signals COMA, COMB, COMC, and COMD. Each of the first to fourth common switch circuits 72A, 72B, 72C, and 72D includes 180 analog switches corresponding to the respective piezoelectric elements PZ. The switching signals are input to the first to fourth common switch circuits 72A, 72B, 72C, and 72D from level shifters 71 which correspond to the respective first to fourth common switch circuits 72A, 72B, 72C, and 72D. The corresponding driving waveform signal COM is input to the input terminal of each of the four system analog switches, and the piezoelectric elements PZ are commonly connected to the output terminal of each of the four system analog switches. The switching signals are input to the respective analog switches from the corresponding level shifters 71. When the corresponding switching signals are at the "H" level, the corresponding driving waveform signals COM are output to the corresponding piezoelectric elements PZ.

Therefore, when the operation of discharging the droplet D is selected using each output control signal PI, the each of the 180 nozzles N (piezoelectric elements PZ) is supplied with any one of the first to fourth driving waveform signals COMA, COMB, COMC, and COMD based on the first to fourth selection common output control signals CPA, CPB, CPC, and CPD. That is, when the operation of discharging the droplet D is selected, each of the 180 nozzles N (piezoelectric elements PZ) is supplied with the driving waveform signal COM according to a rank.

Figure 16:
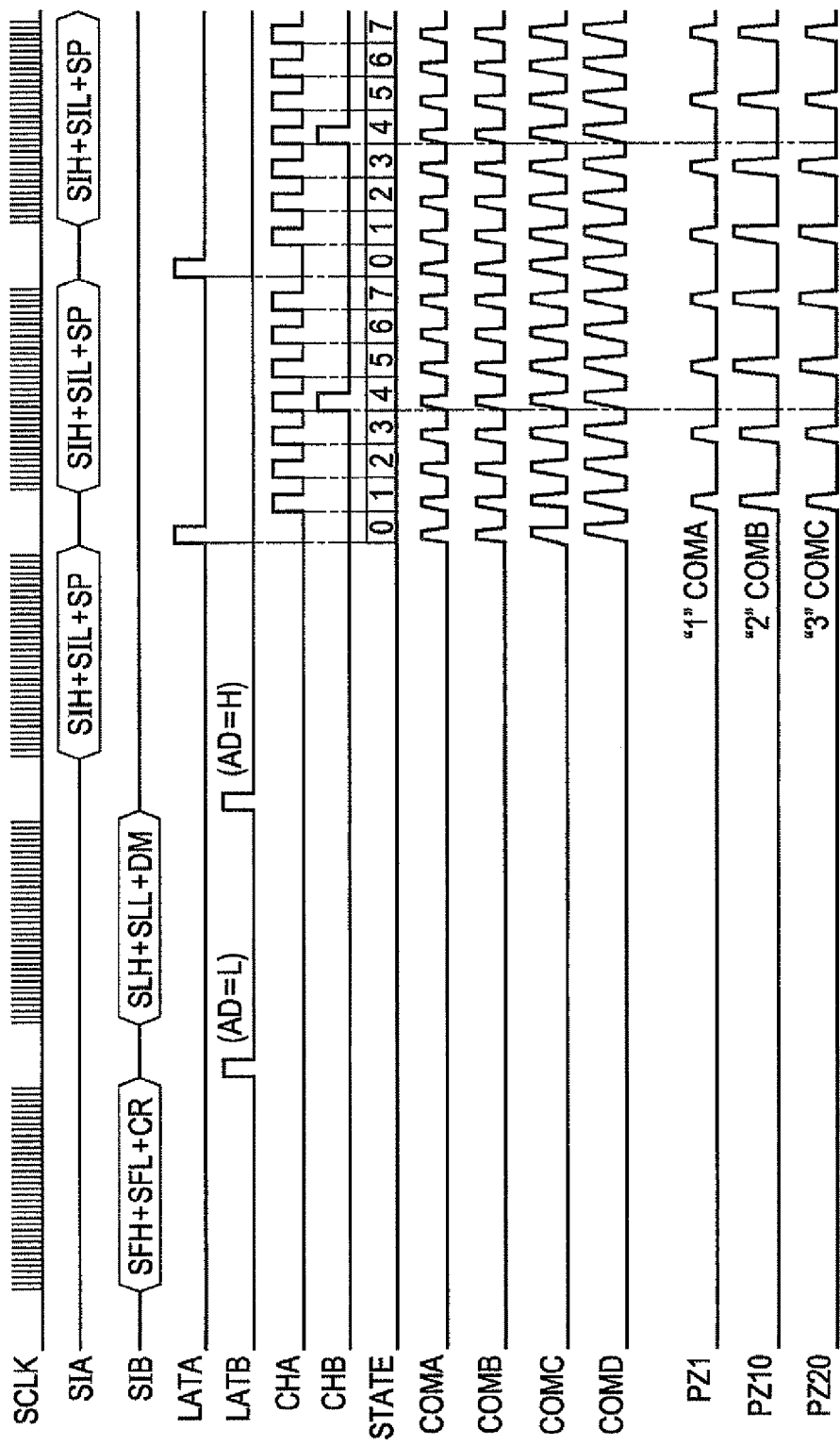
FIG. 16 is a timing chart illustrating driving waveform signals which are supplied to respective piezoelectric elements.

Next, a method of driving the droplet discharge head 18 provided in the droplet discharge apparatus 10 will be described below. FIG. 16 is a timing chart illustrating the driving waveform signal COM which is supplied to each piezoelectric element PZ.

First, as shown FIG. 1, the substrate 6(W) is fixedly provided on the substrate stage 13 in such a way that the discharge surface 6a is placed on the upper side thereof. At this time, the substrate stage 13 allocates the substrate 6(W) in the reverse Y arrow direction of the carriage 17. From this state, the input/output apparatus 40 inputs the drawing data Ip, the reference driving voltage data Iv, and the head data Ih to the control apparatus 30.

Each of the reference driving voltage data Iv and the head data Ih is generated based on the actual weight Iw of each droplet D measured by the droplet weight measurement apparatus 26.

The head data Ih classifies a nozzle N (a first piezoelectric element PZ1) which is positioned in the most X arrow direction as a rank (1), classifies a tenth nozzle N (a tenth piezoelectric element PZ10) counted from the X arrow direction as a rank (2), and classifies a twentieth nozzle N (a twentieth piezoelectric element PZ20) counted from the X arrow direction as a rank (3).

The control apparatus 30 scans the carriage 17 using the motor driving circuit 38, and allocates the carriage 17 such that each discharge head 18 passes over the substrate 6(W) when the substrate 6(W) is scanned in the Y arrow direction.

When the carriage 17 is allocated, the control apparatus 30 starts the scanning of the substrate stage 13 using the motor driving circuit 38.

The control apparatus 30 deploys the head data Ih input from the input/output apparatus 40 to the common selection data. When the common selection data corresponding to a single scan of the substrate stage 13 is deployed, the control apparatus 30 generates the serial common selection data SIB using the common selection data as shown in FIG. 16, and then transmits the corresponding serial common selection data SIB to the head driving circuit 41 in series in synchronization with the transmission clock SCLK.

At this time, the control apparatus 30 transmits the pre-serial common selection data SFB (the pre-higher-level selection data SFH, the pre-lower-level selection data SFL, and the control data CR) in advance, and successively transmits the post-serial common selection data SLB (the post-higher-level selection data SLH, the post-lower-level selection data SLL, and the dummy data DM). Meanwhile, "0" is set to the latch selection data AD included in the control data CR, and "1" is set to the latch selection data AD included in the dummy data DM.

The control apparatus 30 outputs the common selection data latch signal LATE to the head driving circuit 41, and sequentially latches the pre-serial common selection data SFB and the post-serial common selection data SLB on the head driving circuit 41. That is, the head driving circuit 41 reads the latch selection data AD ("0") included in the control data CR of the pre-serial common selection data SFB, and latches the pre-higher-level selection data SFH and the pre-lower-level selection data SFL on the respective pre-higher-level selection data latch 62C and pre-lower-level selection data latch 62B. Further, the head driving circuit 41 reads the latch selection data AD ("1") included in the dummy data DM of the post-serial common selection data SLB, and latches the post-higher-level selection data SLH and the post-lower-level selection data SLL on the respective post-higher-level selection data latch 623 and post-lower-level selection data latch 62D.

Continuously, the control apparatus 30 deploys the drawing data Ip, which is input from the input/output apparatus 40, to dot pattern data. When the dot pattern data corresponding to the single scan of the substrate stage 13 is deployed the control apparatus 30 generates the serial pattern data SIA using the dot pattern data as shown in FIG. 16, and then transmits the corresponding dot pattern data STA to the head driving circuit 41 in series in synchronization with the transmission clock SCLK.

When the substrate stage 13 reaches a predetermined drawing start position, the control apparatus 30 outputs the pattern data latch signal LATA to the head driving circuit 41 as shown in FIG. 16, and latches the serial pattern data SIA (the higher-level selection data SIH, the lower-level selection data SIL, and the pattern data SP) on the head driving circuit 41.

When the pattern data latch signal LATA is output and the serial pattern data SIA is latched, the control apparatus 30 sequentially outputs the state switching signal CHA to the head driving circuit 41, and switches the state in the order of (0), (1), (2), (3), (4), . . . . Further, the control apparatus 30 generates four types of driving waveform signals COM (the first driving waveform signal COMA, the second driving waveform signal COMB, the third driving waveform signal COMC, and the fourth driving waveform signal COMD) using the driving waveform generation circuit 36 with reference to the reference driving voltage data Iv. The control apparatus 30 synchronizes each of the first to fourth driving waveform signals COMA, COMB, COMC, and COMD with the pattern data latch signal LATA and the state switching signal CHA, and then outputs the resulting signals to the head driving circuit 41 for each state.

Further, when the serial pattern data SIA is latched, the head driving circuit 41 matches each data of the pattern data SP with each state according to the higher-level selection data SIH, the lower-level selection data SIL, and the truth table shown in FIG. 8, and defines the discharge or non-discharge of each of the 180 nozzles N (piezoelectric elements PZ) for each state. For example, the first piezoelectric element PZ1, the tenth piezoelectric element PZ10, and the twentieth piezoelectric element PZ20 are caused to select the operation of discharging the droplet D at each (1), (3), (5), and (7) state, as shown in FIG. 16.

In this case, the control apparatus 30 counts the pulse number of the state switching signal CHA, and sets the common switching signal CHB to the "L" state when the state changes from (0) to (3). Since the common switching signal CHB is at the "L" state, the head driving circuit 41 initializes the common selection data state to "F" (pre-selection) at the timing that the pattern data latch signal LATA is input. Thereafter, the head driving circuit 41 generates the first to fourth common selection data control signals PXA, PXB, PXC, and PXD based on the pre-selection using the pre-higher-level selection data SFH latched by the pre-higher-level selection data latch 62C and the pre-lower-level selection data SFL latched by the pre-lower-level selection data latch 62B according to the truth table shown in FIG. 10.

In the present embodiment, in the case of the first piezoelectric element PZ1, only the pre-higher-level selection data SFH is used, and the SFH is set to "00". The head driving circuit 41 is supplied with COMF which causes the first driving waveform signal COMA to be selected and other driving waveform signals COM not to be selected using the pre-higher-level selection data SFH ("00") and according to the truth table shown in FIG. 10.

Likewise, in the case of the tenth piezoelectric element PZ10, the pre-higher-level selection data SFH is set to "01". The head driving circuit 41 generates the first to fourth common selection data control signals PXA, PXB, PXC, and PXD which cause the second driving waveform signal COMB to be selected and other driving waveform signals COM not to be selected using the pre-higher-level selection data SFH ("01"). Therefore, the second driving waveform signal COMB is supplied to the tenth piezoelectric element PZ10 at the states (1) and (3) in which the discharge operation thereof is selected. That is, the pre-driving waveform signal COMF corresponding to the rank (2) is supplied to the tenth piezoelectric element PZ10 of the rank (2).

Further, in the case of the twentieth piezoelectric element PZ20, the pre-higher-level selection data SFH is set to "10". The head driving circuit 41 generates the first to fourth common selection data control signals PXA, PXB, PXC, and PXD which cause the third driving waveform signal COMC to be selected and other driving waveform signals COM not to be selected using the pre-higher-level selection data SFH and pre-lower-level selection data SFL ("10"). Therefore, the third driving waveform signal COMC is supplied to the twentieth piezoelectric element PZ20 at the states (1) and (3) in with the discharge operation thereof is selected. That is, the pre-driving waveform signal COMF corresponding to the rank (3) is supplied to the twentieth piezoelectric element PZ20 of the rank (3).

Continuously, the control apparatus 30 outputs the common switching signal CHB at the timing that the state changes to (4). The head driving circuit 41 switches the common selection data state from "F" (pre-selection) to "L" (post-selection) upon rising the common switching signal CHB. Thereafter, the head driving circuit 41 generates the first to fourth common selection data control signals PXA, PXB, PXC, and PXD using the post-higher-level selection data SLH latched by the post-higher-level selection data latch 62E and the post-lower-level selection data SLL latched by the post-lower-level selection data latch 62D based on the post-selection according to the truth table shown in FIG. 10.

Therefore, the first driving waveform signal COMA is supplied to the first piezoelectric element PZ1 at the states (5) and (7) in which the discharge operation thereof is selected. That is, the post-driving waveform signal COML corresponding to the rank (1) is supplied to the first piezoelectric element PZ1 in the rank (1). Likewise, the second driving waveform signal COMB is supplied to the tenth piezoelectric element PZ10 at the states (5) and (7) in which the discharge operation thereof is selected. That is, the post-driving waveform signal COML corresponding to the rank (2) is supplied to the tenth piezoelectric element PZ10 in the rank (2). Further, the third driving waveform signal COMC is supplied to the twentieth piezoelectric element PZ20 at the states (5) and (7) in which the discharge operation thereof is selected. That is, the post-driving waveform signal COML corresponding to the rank (3) is supplied to the twentieth piezoelectric element PZ20 in the rank (3).

Hereinafter, likewise, the control apparatus 30 counts the pulse number of the state switching signal CHA, and then outputs the common switching signal CHB at the timing that the state changes to (4) again. The head driving circuit 41 switches the common selection data state upon rising the common switching signal CHB. Therefore, whenever the state changes to (4), the pre-selection discharge operation at each of the states (5), (7), (1), and (3) and the post-selection discharge operation at each of the same states (5), (7), (1), and (3) are repeated. In the present embodiment, a single type driving waveform signal is supplied to a single piezoelectric element.

Nozzle Discharge Quantity Correction Method

Figure 5A:
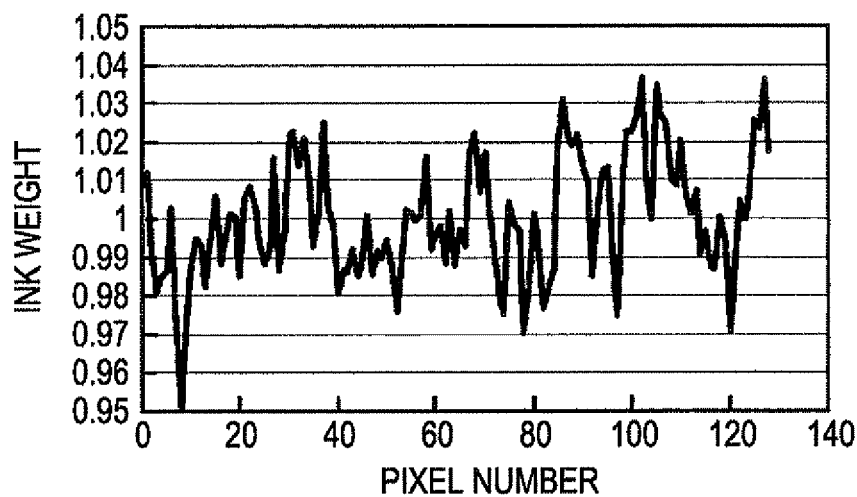
FIG. 5A is a graph illustrating the distribution of the discharge weight which is discharged to respective discharge regions before correction is performed.
Figure 5B:
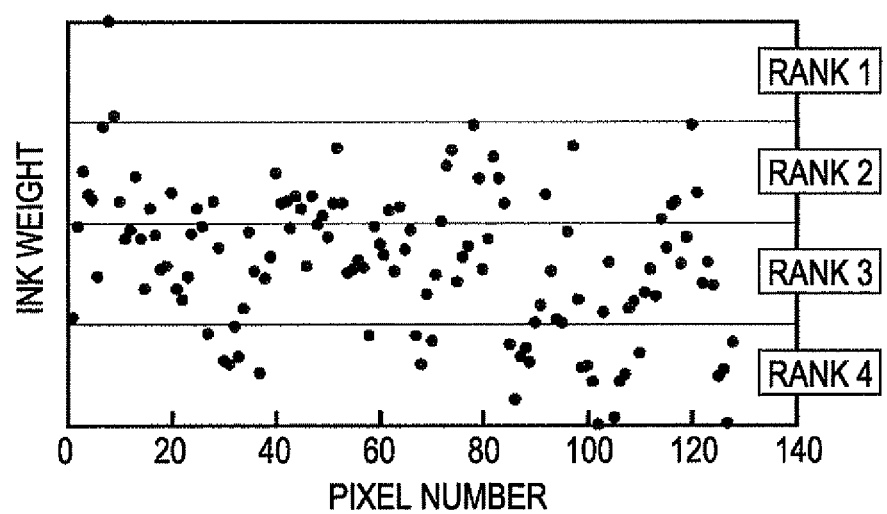
FIG. 5B is a graph illustrating the distribution of the correction quantity of a nozzle array for the respective discharge regions.
Figure 5C:
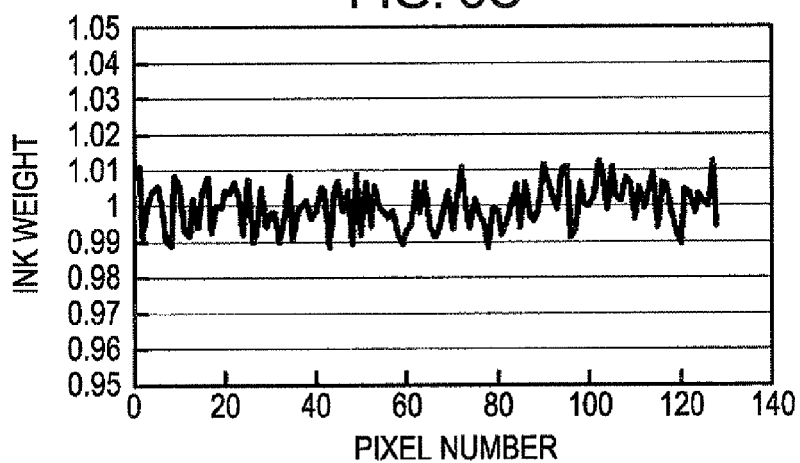
FIG. 5C is a graph illustrating the distribution of the discharge weight of the respective discharge regions after correction is performed on the nozzle array.
Figure 5D:
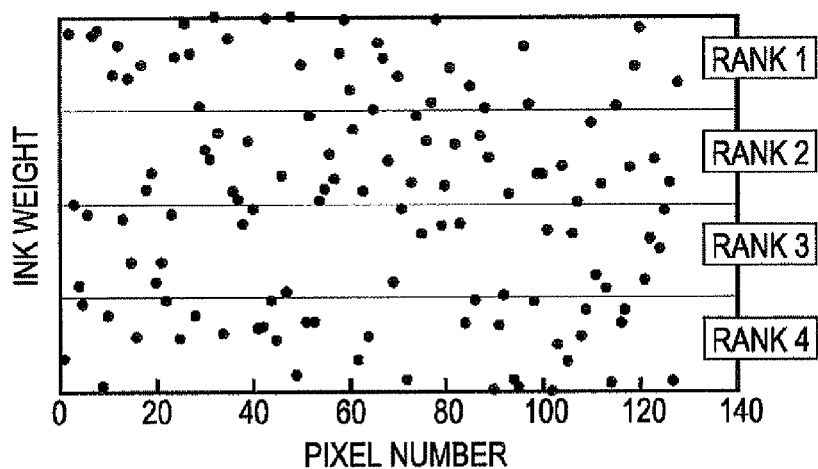
FIG. 5D is a graph illustrating the distribution of the correction quantity of the nozzle array for the respective discharge regions.
Figure 5E:
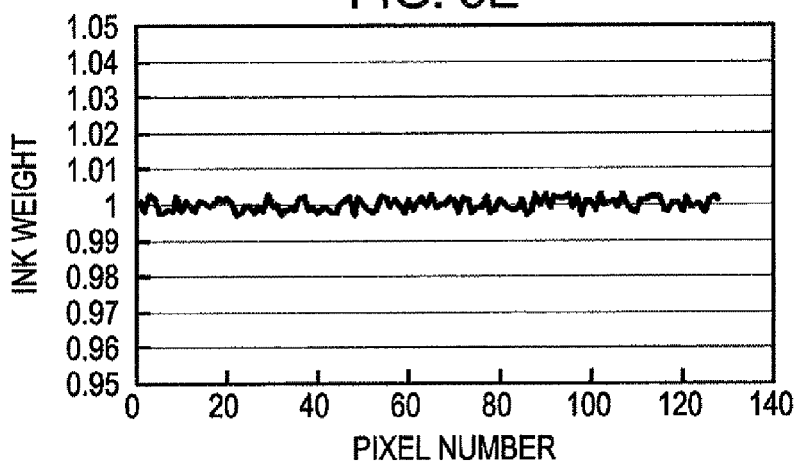
FIG. 5E is a graph illustrating the distribution of the discharge weight of the respective discharge regions after correction is performed on the nozzle array.

Next, a nozzle discharge quantity correction method according to the present embodiment will be described with reference to FIGS. 5A to 5E. FIG. 5A is a graph illustrating the distribution of the discharge weight which is discharged to each discharge region before correction is performed, FIG. 5B is a graph illustrating the distribution of the correction quantity of a nozzle array for each discharge region, FIG. 5C is a graph illustrating the distribution of the discharge weight of each discharge region after correction is performed on the nozzle array, FIG. 5D is a graph illustrating the distribution of the correction quantity of the nozzle array for each discharge region, and FIG. 5E is a graph illustrating the distribution of the discharge weight of each discharge region after correction is performed on the nozzle array.

First, in a first step, correction quantity $Vc_1$, which is used to correct entire ink weight in a sub pixel (discharge region) including the ink weight discharged from a nozzle Nb, is calculated by correcting only ink weight discharged from a nozzle Na.

When, for example, the ink weight of the droplet D which is discharged to the sub pixel (discharge region) from the nozzle Na is $Va_1$, the discharge frequency thereof is $Ca_1$, the ink weight of the droplet D discharged from the nozzle Nb is $Vb_1$, a discharge frequency thereof is $Cb_1$, and the target ink weight (predetermined amount) of each sub pixel (discharge region) is Vd, the correction quantity $Vc_1$ can be obtained using the following Equation (1):

$$Vc_1 = (Va_1 Ca_1 + Vd - (Va_1 \times Ca_1 + Vb_1 Cb_1))/(Va_1 \times Ca_1)$$

When this calculation is performed on the entire nozzle Na of the nozzle array 22a, which performs the discharge, the correction quantity, as shown in FIG. 5B, is obtained with respect to the discharge weight for each sub pixel shown in FIG. 5A.

When it is assumed that the maximum value of the obtained correction quantity Vc1 of each nozzle Na of the nozzle array 22a is Vc1max and the minimum value thereof is Vc1min, the rank (1) is set to the nozzle Na in which the correction quantity Vc1 is in the range of Vc1min+(Vc1max−Vc1min)/4× 3<Vc1≤Vc1max, the rank (2) is set to the nozzle Na in which the correction quantity Vc1 is in the range of Vc1min+(Vc1max−Vc1min)/2<Vc1≤Vc1min+(Vc1max−Vc1min)/4×3, the rank (3) is set to the nozzle Na in which the correction quantity Vc1 is in the range of Vc1min+(Vc1max−Vc1min)/4<Vc1≤Vc1min+(Vc1max−Vc1min)/2, and the rank (4) is set to the nozzle Na in which the correction quantity Vc1 is in the range of Vc1min≤Vc1≤Vc1min+(Vc1max−Vc1min)/4.

Next, driving voltage correction quantity Vhpara, which is used to correct the discharge weight corresponding to the four ranks obtained through classification, is obtained for each rank. The driving voltage correction quantity Vhpara is obtained by reflecting the coefficient of the quantity of the change of the discharge weight, obtained when the reference driving voltage $Vh_0$ measured by the droplet weight measurement apparatus 26 is changed, to the average value of the charge weight of each nozzle Na of a nozzle group corresponding to each rank or a value Vc1cen obtained by (maximum value+minimum value)/2.

Next, the correction quantity Vc2, which is used to correct the entire ink weight in the sub pixel including a corrected ink weight Va1' discharged from the nozzle Na, is calculated by correcting only ink weight discharged from a nozzle Nb.

The corrected ink weight Va1', which is discharged from the nozzle Na, is calculated using the rank in which the ink weight of the nozzle Na is classified as Va1 and the correction quantity Vhpara, and the ink quantity is corrected to the variation shown in FIG. 5C at the time point that the correction of the nozzle Na is completed.

The correction quantity Vc2 can be obtained by, for example, the following Equation (2):

$$Vc2 = (Vb1 \times Cb1 + Vd - (Va1' \times Ca1 + Vb1 \times Cb1))/(Vb1 \times Cb1) \quad (2)$$

The correction quantity, as shown in FIG. 5D, is obtained by performing the calculation on the entire nozzle Nb which performs the discharge of the nozzle array 22b.

When it is assumed that the maximum value of the obtained correction quantity Vc2 of each nozzle Nb of the nozzle array 22b is Vc2max and the minimum value thereof is Vc2 min, the rank (1) is set to the nozzle Na in which the correction quantity Vc2 is in the range of Vc2min+(Vc2max−Vc2min)/4× 3<Vc2≤Vc2max, the rank (2) is set to the nozzle Na in which the correction quantity Vc2 is in the range of Vc2min+(Vc2max−Vc2min)/2<Vc2≤Vc2min+(Vc2max−Vc2min)/4×3, the rank (3) is set to the nozzle Na in which the correction quantity Vc2 is in the range of Vc2min+(Vc2max−Vc2min)/4<Vc2≤Vc2min+(Vc2max−Vc2min)/2, and the rank (4) is set to the nozzle Na in which the correction quantity Vc2 is in the range of Vc2min≤Vc2≤Vc2min+(Vc2max−Vc2min)/4.

Next, driving voltage correction quantity Vhparb, which is used to correct the discharge weight corresponding to the four ranks obtained through classification, is obtained for each rank. The driving voltage correction quantity Vhparb is obtained by reflecting the coefficient of the quantity of the change of the discharge weight, obtained when the reference driving voltage $Vh_0$ measured by the droplet weight measurement apparatus 26 is changed, to the average value of the charge weight of each nozzle Na of a nozzle group corresponding to each rank or a value Vc2cen obtained by (maximum value+minimum value)/2.

As described above, the correction can be performed to the ink weight variation shown in FIG. 5E.

Hereinbefore, although the correction method using the two nozzle arrays has been described, the correction method is not limited thereto and can be performed whenever discharge is performed. When a plurality of droplets are discharged from the same nozzle N to the same discharge region, correction can be performed by performing discharge while switching the above-described pre-driving waveform signal COMF and the post-driving waveform signal COML for each discharge. In this case, the correction quantity Vc1 is assigned to COMF and the correction quantity Vc2 is assigned to COML.

Further, the present embodiment can be realized whenever scanning is performed. When droplets are discharged to the same discharge region by performing vertical scanning a plurality of times, the correction quantity Vc1 is assigned to first vertical scanning and the correction quantity Vc2 is assigned to second scanning.

When the number of times of the vertical scanning in which the droplets are discharged to the same discharge region is equal to or greater than 3, the correction quantity is calculated to as many as the number of times of the vertical scanning, such as Vc3, Vc4 . . . , thereby enabling higher accuracy correction to be performed.

Meanwhile, when each scanning is performed, the same nozzle N is not necessarily used to discharge the droplets to the same discharge region, and different nozzles N can be used to discharge the droplets whenever the scanning is performed by changing the position of the vertical scanning.

When different nozzles N are used to discharge the droplets whenever the scanning is performed, droplet weight measurement errors or correction quantity errors for each nozzle N can be dispersed, thereby enabling the higher accuracy correction to be performed.

Meanwhile, the embodiment may be modified as follows.

Although the correction quantity Vc1 and Vc2, which are used to correct the discharge weight in the order of the nozzle array 22a and the nozzle array 22b, are obtained and the correction quantity Vc1 and Vc2 are deployed as discharge data without change in the embodiment, the correction quantity Vc1 and Vc2 can be obtained in the order of the nozzle array 22b and the nozzle array 22a regardless of the order of calculation.

Therefore, since the calculation order and the discharge order in the combined nozzle arrays are not restricted, the variation in discharge weight for each nozzle N is obtained in units of a nozzle array and great nozzle discharge quantity correction width (Vc1) is assigned to the nozzle array in which the variation in discharge weight is small, thereby enabling the higher accurate discharge weight correction to be performed.

Not only this, but the number of times that discharge is performed to a specific sub pixel from each of the nozzle arrays, for example, the nozzle array 22a and nozzle array 22b of the nozzle array which is combined is not necessarily the same.

Therefore, since the number of times that the droplets are discharged can be freely set, the quantity of ink which is received in the sub pixel can be adjusted with the high degree of freedom. Further, when the discharge frequency of the nozzle array which performs the calculation of the correction quantity Vc1 which causes the correction width to have the maximum value is set to greater than the discharge frequency of another nozzle array, the weight of the droplets which are discharged to the sub pixel from the nozzle array which performs the calculation of Vc1 is greater than the weight of the droplets which are discharged from another nozzle array, so that the correction width obtained using Vc1 can be narrow, thereby enabling the higher accurate discharge weight correction to be performed.

Further, when the discharge weight correction is performed on the same sub pixel using different vertical scanning combination, it is preferable to perform discharge on the sub pixel using different nozzles for each vertical scanning.

Therefore, since droplets are discharged to the sub pixel using different nozzles N for each vertical scanning, so that droplets are discharged to the sub pixel using a greater number of nozzles N for each vertical scanning. Therefore, the measurement error of the droplet weight measured by the droplet weight measurement apparatus 26 can be dispersed, and the higher accuracy discharge weight correction can be performed.

Organic EL Device Manufacturing Method

Figure 17:
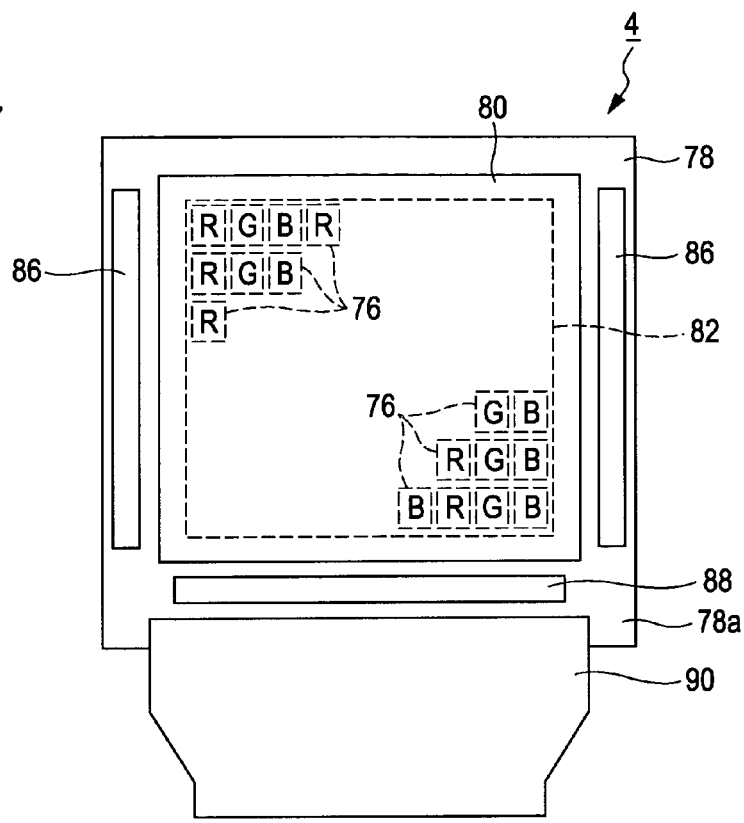
FIG. 17 is a front view schematically illustrating an organic EL apparatus according to the present embodiment.
Figure 18:
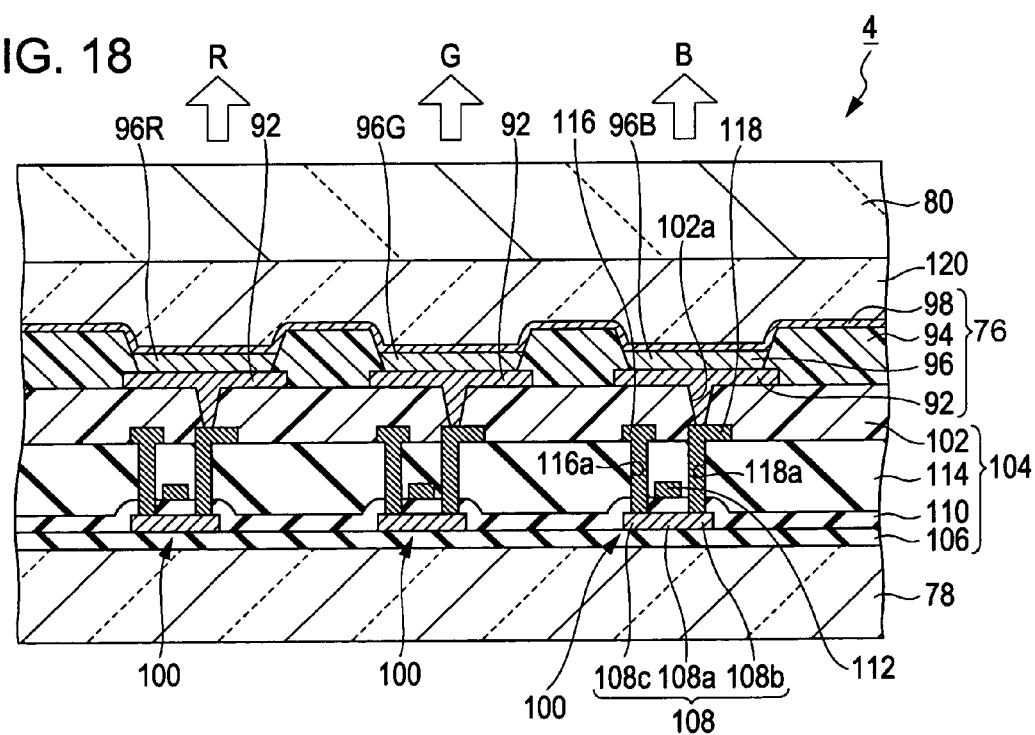
FIG. 18 is a sectional view schematically illustrating the main sections of the organic EL apparatus according to the present embodiment.

Next, an organic EL apparatus which includes an organic EL device manufactured using the organic EL device manufacturing method according to the present embodiment will be described with reference to FIGS. 17 and 18. FIG. 17 is a front view schematically illustrating the organic EL apparatus according to the present embodiment, and FIG. 18 is a sectional view schematically illustrating the main sections of the organic EL apparatus according to the present embodiment.

As shown in FIG. 17, an organic EL apparatus 4 according to the present embodiment includes an element substrate 78 which includes emission pixels 76 each having three colors, that is, R (red), G (green), and B (blue), and a sealing substrate 80 which is allocated to face the element substrate 78 at a predetermined interval. The sealing substrate 80 is joined to the element substrate 78 using sealant which has high air tightness so as to seal an emitting region 82 on which the plurality of emission pixels 76 are provided.

Each of the emission pixels 76 includes an organic EL device 84 (refer to FIG. 18) functioning as an emitting element which will be described later, and the emission pixels 76, which can obtain the same color light emission, are arranged in the longitudinal direction of the drawing based on so-called stripe method. Meanwhile, actually, the emission pixels 76 are minute but are enlarged for the purpose of convenience in the drawing.

The element substrate 78 has a size larger than that of the sealing substrate 80, and two scanning line driving circuit units 86, which drive the emission pixels 76, and a single data line driving circuit unit 88 are provided in a projecting portion in a frame shape. The scanning line driving circuit units 86 and the data line driving circuit unit 88 may be mounted in the element substrate 78 as, for example, Integrated Circuits (ICs) in which electrical circuits are integrated, and the corresponding driving circuit units 86 and 88 may be directly formed on the surface of the element substrate 78.

A relay substrate 90, which is used to connect the driving circuit units 86 and 88 and the external driving circuit, is mounted on the terminal portion 78a of the element substrate 78. For example, a flexible circuit substrate or the like may be used as the relay substrate 90.

As shown in FIG. 18, in the organic EL apparatus 4, the organic EL device 84 includes an anode 92 which functions as a pixel electrode, a barrier unit 94 which partitions the anode 92, and a functional layer 96 which includes an emission layer having an organic film formed on the anode 92. Further, the organic EL device 84 includes a cathode 98 which functions as a common electrode formed to face the anode 92 via the functional layer 96.

The barrier unit 94 is made of photosensitive resin, such as phenol, polyimide or the like, which has insulation properties, and is provided to partition each of the plurality of anodes 92 by converting the part of the circumference of anode 92 included in the emission pixel 76.

The anode 92 is an electrode which is connected to one of the three terminals of the Thin Film Transistor (TFT) element 100 formed on the element substrate 78, and which is made by depositing, for example, Indium Tin Oxide (ITO) which is a transparent electrode material with a thickness of 100 nm. Meanwhile, although not shown in the drawing, a reflective layer formed of Al is provided on the lower layer of the anode 92 (the side of a planarizing layer 102) via an insulation layer. The corresponding reflective layer reflects emitting light of the functional layer 96 into the side of the sealing substrate 80. Further, the material of the corresponding reflective layer is not limited to Al, and may have a function (reflection surface) of reflecting emitting light. For example, a method of forming an uneven reflection surface using an organic material or an inorganic material having insulation properties, a method of forming an ITO film on a surface layer by configuring the anode 92 itself using a conductive material having a reflection function, or the like may be used.

Likewise, the cathode 98 is formed of a transparent electrode material such as ITO.

The organic EL apparatus 4 according to the present embodiment has a so-called top emission-type structure, causes driving current to flow through between the anode 92 and the cathode 98, reflects light emitted from the functional layer 96 onto the reflective layer, and then draws the light from the side of the sealing substrate 80. Therefore, a substrate which is formed of a transparent glass is used as the sealing substrate 80. Further, any of the transparent substrate and the opaque substrate may be used as the element substrate 78. As the opaque substrate, for example, thermo-hardening resin, thermoplastic resin, or the like may be used in addition to a material obtained by performing an insulation process, such as surface oxidation, on ceramics, such as aluminum or the like, and on a metal sheet such as stainless steel or the like.

The element substrate 78 is provided with the circuit unit 104 which drives the organic EL device 84. That is, a base passivation layer 106, which includes $SiO_2$ as a main constituent, is formed on the surface of the element substrate 78 as a base, and a silicon layer 108 is formed on the base passivation layer 106. A gate insulation layer 110 which includes $SiO_2$ and/or SiN as a main constituent is formed on the surface of the silicon layer 108.

Further, a region which is superimposed on the gate electrode 112 while interposing the gate insulation layer 110 therebetween becomes the channel region 108a of the silicon layer 108. Meanwhile, the gate electrode 112 is a part of the scanning line which is not shown. Meanwhile, a first interlayer insulation layer 114 which includes $SiO_2$ as a main constituent is formed on the surface of the gate insulation layer 110 which covers the silicon layer 108 and on which the gate electrode 112 is formed.

Further, a lightly-doped source region and a heavily-doped source region 108c are provided on the side of the source of the channel region 108a of the silicon layer 108 and a lightly-doped drain region and a heavily-doped drain region 108b are provided on the side of the drain of the channel region 108a, thereby forming a so-called Light Doped Drain (LDD) structure. From among them, the heavily-doped source region 108c is connected to a source electrode 116 via a contact hole 116a which penetrates through the gate insulation layer 110 and the first interlayer insulation layer 114. The source electrode 116 is configured as a part of a power line (not shown). Meanwhile, the heavily-doped drain region 108b is connected to the drain electrode 118 which is provided on the same layer with the source electrode 116 via the contact hole 118a which penetrates through the gate insulation layer 110 and the first interlayer insulation layer 114.

A planarizing layer 102 which includes, for example, an acrylic resin component as a main constituent is formed on the upper surface of the first interlayer insulation layer 114 on which the source electrode 116 and the drain electrode 118 are formed. The planarizing layer 102 is formed of heat-resisting insulation property resin, such as acrylic, polyimide series, or the like, and is a well-known layer which is formed to remove the unevenness of the surface which is generated by the TFT element 100, the source electrode 116, the drain electrode 118 or the like.

Further, the anode 92 is formed on the surface of the planarizing layer 102, and is connected to the drain electrode 118 via the contact hole 102a provided on the corresponding planarizing layer 102. That is, the anode 92 is connected to the heavily-doped drain region 108b of the silicon layer 108 via the drain electrode 118. The cathode 98 is connected to GND. Therefore, driving current, which is supplied to the anode 92 from the power line and which flows through between the anode 92 and the cathode 98, is controlled by the TFT element 100 which functions as a switching element. Therefore, the circuit unit 104 allows the desired organic EL device 84 to emit light, thereby enabling colors to be displayed.

Meanwhile, the configuration of the circuit unit 104 which drives the organic EL device 84 is not limited thereto.

The functional layer 96 includes a plurality of thin film layers including a hole-injection layer, an intermediate layer, and an emission layer which are formed of an organic film, and the layers are laminated in this order from the side of the anode 92. In the present embodiment, the thin film layers are deposited using a droplet discharging method (ink jet method).

As the material of the hole-injection layer, for example, mixture (PEDOT/PSS) in which polystyrene sulfonic acid (PSS) functioning as dopant is added to polythiophene derivative, such as polyethylenedioxythiophene (PEDOT) or the like, polystyrene, polypyrrole, polyaniline, polyacetylen, or the derivative thereof may be used.

The intermediate layer is provided between the hole-injection layer and the emission layer. The intermediate layer is provided to improve the transportation properties (injection properties) of the holes with respect to the emission layer, and to restrain electrodes from permeating from the emission layer into the hole-injection layer. That is, the intermediate layer is provided to improve the efficiency of the emission due to the combination of the holes and the electrons of the emission layer. As the material of the intermediate layer, a material which includes, for example, triphenyl amine series polymer which has excellent hole-transportation properties may be used.

As the material of the emission layer, for example, polyfluorene (PF) derivative which can obtain light emission of red, green and blue, polyphenylene vinylene (PPV) derivative, polypropylene (PP) derivative, polyphenylene (PPP) derivative, polyvinylcarbazole (PVK), and polymethyiphenylsilane (PMPS) such as PEDOT or the like. Further, a polymer molecule material, such as perylene series pigment, coumalin series pigment, rhodamine series pigment or the like, or a low molecular material, such as rubrene, perylene, 9,10-diphenylanthracene, Tetraphenylbutadiene, nile red, coumalin 6, Quinacridone or the like, may be doped on the polymer molecule material.

The element substrate 78 which includes the organic EL device 84 is solidified with the transparent sealing substrate 80 without gaps via a sealing layer 120 which uses the transparent thermoset epoxide resin or the like as a sealing member.

The organic EL apparatus 4 according to the present embodiment is manufactured using a method of manufacturing the organic EL device 84, which will be described later. Since the emission layer has an approximately uniform film thickness, desired emission properties are obtained respectively in the functional layers 96R, 96G, and 96B which obtain emission colors which are different from each other.

Meanwhile, the organic EL apparatus 4 according to the present embodiment is not limited to the top emission type. The organic EL apparatus 4 may has a bottom emission-type structure in which the cathode 98 functioning as a common electrode is deposited using a conductive material, such as opaque Al or the like, which has a reflection function, and in which light emitted from the organic EL device 84 is reflected using the cathode 98, and extracted from the side of the element substrate 78.

Organic EL Device Manufacturing Method

Figure 19:
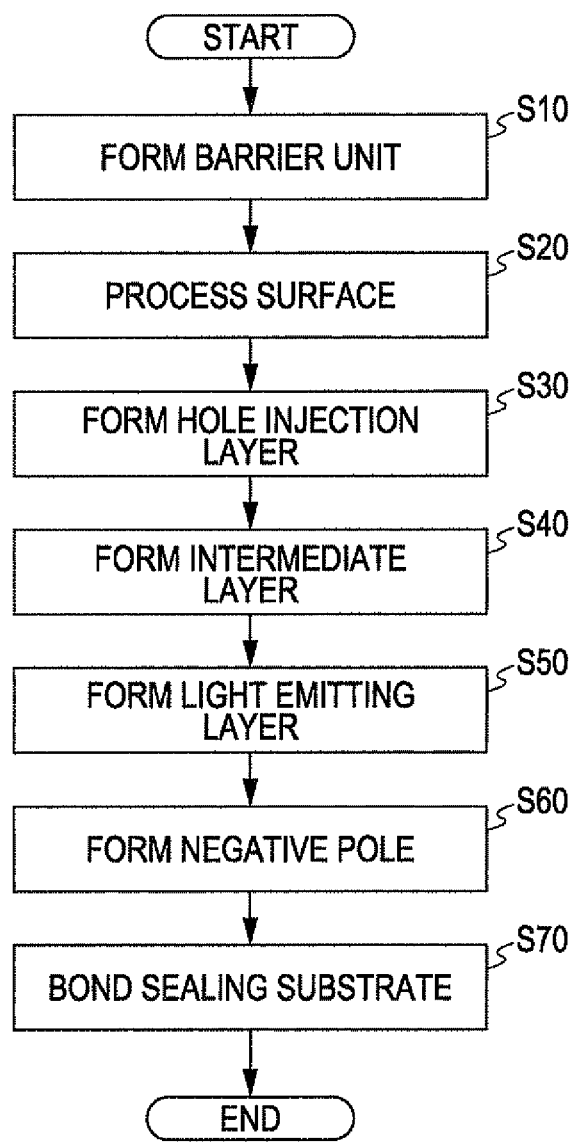
FIG. 19 is a flowchart illustrating an organic EL apparatus manufacturing method according to the present embodiment.

Next, an organic EL device manufacturing method according to the present embodiment will be described with reference to FIGS. 19 to 21D. FIG. 19 is a flowchart illustrating the organic EL apparatus manufacturing method according to the present embodiment, and FIGS. 20A to 20D and FIGS. 21A to 21D are views schematically illustrating the organic EL device manufacturing method according to the present embodiment.

The organic EL device manufacturing method according to the present embodiment includes at least a barrier unit formation operation in step S10, a surface process operation of performing a surface process on the substrate on which a barrier unit is formed in step S20, a hole-injection layer formation operation in step S30, an intermediate layer formation operation in step S40, an emission layer formation operation in step S50, a cathode formation operation in step S60, and a sealing substrate junction operation of making the element substrate 78 on which the organic EL device is formed with a sealing substrate 80 in step S70, as shown in FIG. 19. Meanwhile, since the operation of forming the circuit unit 104 on the element substrate 78 (refer to FIG. 18) and the operation of forming the anode 92 which is electrically connected to the circuit unit 104 may be performed using well-known manufacturing methods, the detailed description thereof will be omitted in the present embodiment. Therefore, the circuit unit 104 is not shown in FIGS. 20A to 20D and FIGS. 21A to 21D.

Figure 20A:
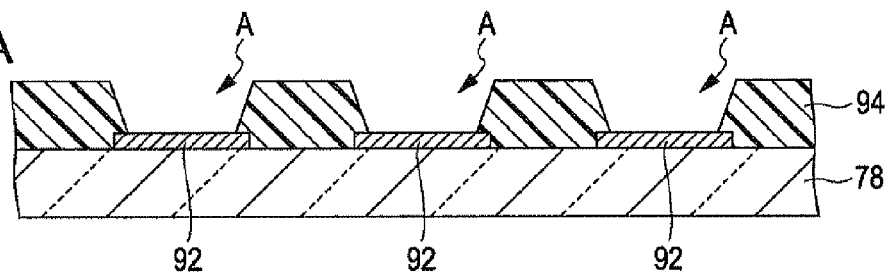
FIGS. 20A to 20D are views schematically illustrating the organic EL device manufacturing method according to the present embodiment.

Step S10 in FIG. 19 is the barrier unit formation operation. In step S10, barrier units 94 are formed such that the barrier units 94 cover around the parts of the anodes 92 so as to partition off the anodes 92, as shown in FIG. 20A. As a formation method, for example, photosensitive phenol resin or polyimid resin is doped with a thickness of approximately 1 to 3 μm on the surface of the element substrate 78 on which the anodes 92 are formed. A transfer method, a slit coating method, or the like may be used as the doping method. Further, the plurality of barrier units 94 can be formed by performing exposure and development using a mask corresponding to the shape of the emission pixel 76. Thereafter, the regions of the emission pixels 76 partitioned off by the barrier units 94 are called film formation regions A. Thereafter, the process proceeds to step S20.

Step S20 in FIG. 19 is the surface process operation. In step S20, a lyophilic process and a liquid repelling process are performed on the surface of the element substrate 78 on which the barrier units 94 are formed. First, a plasma process of using oxygen as processing gas is performed, and the lyophilic process is performed on the surface of the anode 92 which is chiefly formed of an inorganic material. Next, a plasma process of using fluorine series gas, such as $CF_4$, as processing gas is performed, and the liquid repelling process is performed on the surface of the barrier unit 94 which is formed of an organic material by introducing fluorine. Thereafter, the process proceeds to step S30.

Figure 20B:
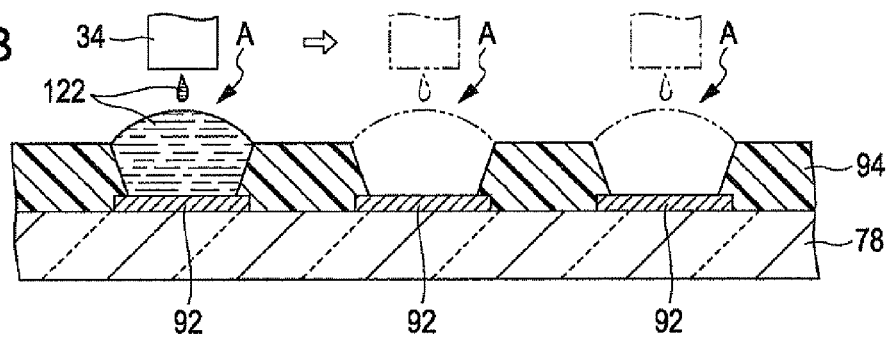

Step S30 in FIG. 19 is the hole-injection layer formation operation. In step S30, first, liquid 122 including a hole injection transportation layer formation material is doped on the film formation region A, as shown in FIG. 20B. The liquid 122 includes, for example, diethylene glyco and water (pure water) as a solvent, and includes the PEDOT/PSS at a weight ratio of approximately 0.5% as a hole-injection layer formation material. The proportion of the solvent is adjusted such that the degree of viscosity is equal to or less than approximately 20 mPa·s.

In a method of doping the liquid 122, a discharge apparatus 10 which can discharge liquid (ink) from the nozzle N of the discharge head 18 is used. The discharge head 18 faces the element substrate 78 which is a work (W), and the liquid 122 is discharged from the discharge head 18. The discharged liquid 122 is deposited on the anode 92 on which the lyophilic process is performed in the form of droplets, and gets wet. Further, the necessary quantity based on the area of the film formation region A is discharged in the form of droplets such that the film thickness of the hole-injection layer after drying is approximately 50 nm to 70 nm. Thereafter, the process proceeds to a drying operation.

Figure 20C:
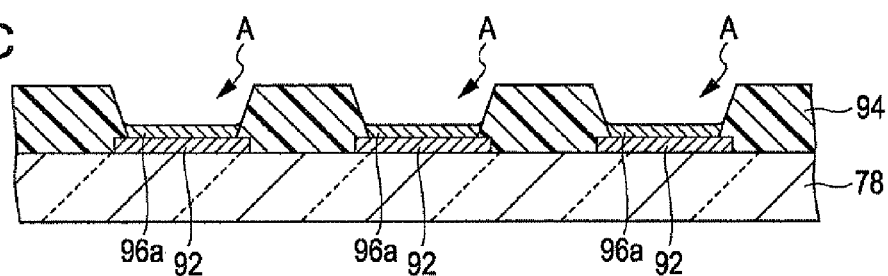

In the drying operation, when the element substrate 78 is heated using, for example, a lamp annealing method or the like, the solvent components of the liquid 122 are dried and then removed, and a hole-injection layer 96a is formed on the anode 92 of the film formation region A, as shown in FIG. 20C. Meanwhile, although the hole-injection layer 96a, which is formed of the same material, is formed in the each film formation region A in the present embodiment, the material of the hole-injection layer 96a may be changed for each emission color with respect to the emission layer which is formed later. Thereafter, the process proceeds to step S40.

Figure 20D:
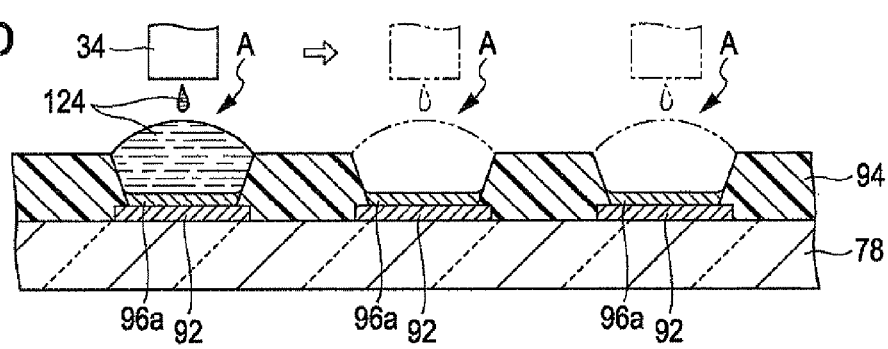

Step S40 in FIG. 19 is the intermediate layer formation operation. In step S40, liquid 124 including an intermediate layer formation material is applied to the film formation region A, as shown in FIG. 20D.

The liquid 124 includes, for example, cyclohexylbenzene as a solvent and includes the above-described triphenylamine series polymer at a weight ratio of approximately 0.1% as the intermediate layer formation material. The degree of viscosity is approximately 6 mPa·s.

In a method of doping the liquid 124, the discharge apparatus 10 is used like the case where the liquid 122 is doped. The necessary quantity based on the area of the film formation region A is discharged in the form of droplets such that the film thickness of the intermediate layer after drying is approximately 10 nm to 20 nm. Thereafter, the process proceeds to a drying operation.

Figure 21A:
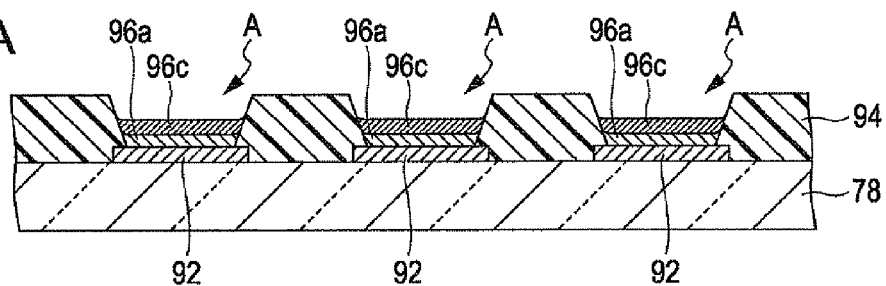
FIGS. 21A to 21D are views schematically illustrating the organic EL device manufacturing method according to the present embodiment.

In the drying operation, when the element substrate 78 is heated using, for example, the lamp annealing method or the like, the solvent components of the liquid 124 are dried and then removed, and an intermediate layer 96c is formed on the hole-injection layer 96a of the film formation region A, as shown in FIG. 21A. Thereafter, the process proceeds to step S50.

Figure 21B:
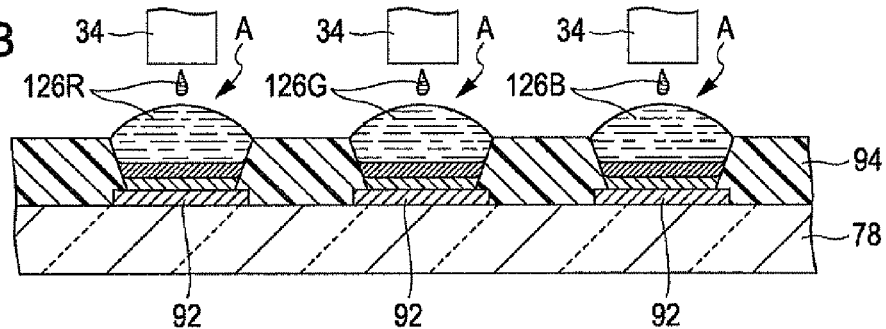

Step S50 in FIG. 19 is the emission layer formation operation. In step S50, liquids 126R, 126G, and 126B, each including the emission layer formation material, are respectively doped to the corresponding film formation regions A, as shown in FIG. 21B.

As the liquids 126R, 126G, and 126B, a material which includes, for example, cyclohexylbenzene as a solvent and which includes PF at a weight ratio of 0.7% as the emission layer formation material, is used. The degree of viscosity is approximately 14 mPa·s.

In a method of doping the liquids 126R, 126G, and 126B, the discharge apparatus 10 is also used. The liquids 126R, 126G, and 126E are charged to the discharge heads 18 which are different from each other, and then discharged therefrom.

When the emission layer is deposited, the droplet discharging method, which enables the liquids 126R, 126G, and 126B to be uniformly discharged to the film formation regions A and the necessary quantity to be stably discharged, is used. That is, a rank is divided into four ranks of COMA, COMB, COMC, and COMA in order to mutually correct the variation in weight of each of the nozzle arrays based on the variation in each discharge weight of the two nozzle arrays 22a and 22b of the discharge head 18, the voltage of each rank is determined based on the mid-value or the average value of the discharge weight of the nozzles N which belong to each rank, and then droplets, in which the discharge weight is corrected, are discharged.

The necessary quantity according to the area of the film formation region A is discharged in the form of droplets such that the film thickness of the emission layer after drying becomes approximately 50 nm to 100 nm. Thereafter, the process proceeds to the drying operation as a solidification operation.

Figure 21C:
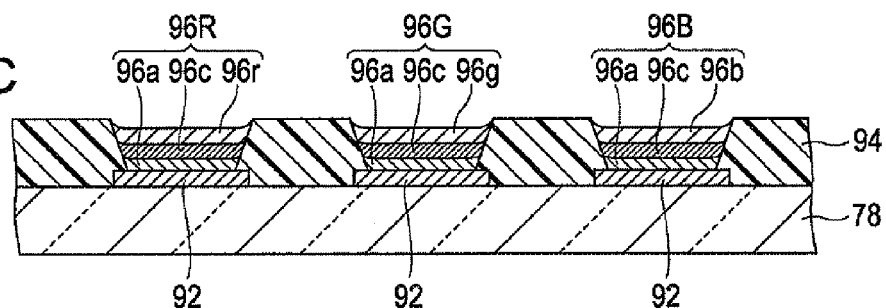

A drying under reduced pressure method which can comparatively uniformly dry the solvent components is used as the drying operation performed on the discharged liquids 126R, 126G, and 126B in the present embodiment, compared to general drying by heating. By using the droplet discharging method, a necessary amount of liquids 126R, 126G, and 126B is evenly doped on the film formation regions A. Therefore, as shown in FIG. 21C, emission layers 96r, 96g, and 96b which are formed after drying operation have approximately uniform film thickness for each film formation region A. Thereafter, the process proceeds to step S60.

Figure 21D:
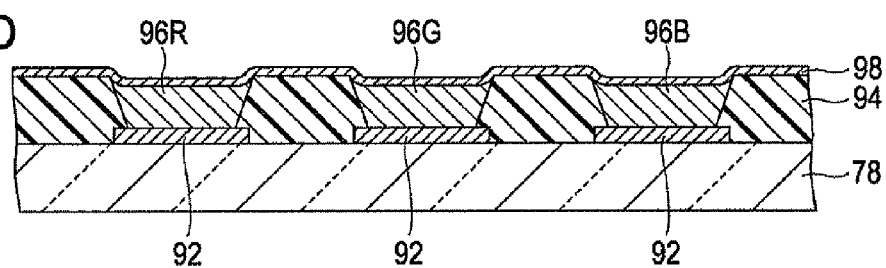

Step S60 in FIG. 19 is the cathode formation operation. In step S60, as shown in FIG. 21D, the cathode 98 is formed to cover the barrier units 94 and each of the functional layers 96R, 96G, and 96B. Therefore, the organic EL device 84 is configured.

It is preferable that a metal, such as ITO, Ca, Ba, Al or the like, be combined with fluoride, such as LiF or the like, and the resulting material used as the material of the cathode 98. In particular, it is preferable that a film formed of Ca, Ba, or LiF which has a small work function, be formed on a side which is near to the functional layers 96R, 96G, and 96B, and a film formed of ITO which has a large work function be formed on a side which is far from the functional layers. Further, a passivation layer formed of $SiO_2$, SiN, or the like may be laminated on the cathode 98. Therefore, the oxidation of the cathode 98 can be prevented. As a method of forming the cathode 98, an evaporation method, a sputter technique, a Chemical Vacuum Deposition (CVD) method or the like may be used. In particular, it is preferable to use the evaporation method in that the damage to the functional layers 96R, 96G, and 96B due to heat can be prevented. Thereafter, the process proceeds to step S70.

Step S70 in FIG. 19 is the sealing substrate junction operation. In step S70, the transparent sealing layer 120 is coated on the element substrate 78 on which the organic EL device 84 is formed, and then solidified with the transparent sealing substrate 80 without gaps (refer to FIG. 18). Further, it is preferable that an adhesion layer is provided and jointed on the circumference region of the sealing substrate 80 in order to prevent the entry of moisture, oxygen or the like.

According to the above-described method of manufacturing the organic EL device 84, the deposition irregularity of the functional layers 96R, 96G, and 96B which are deposited using the droplet discharging method is reduced, thereby including the respective emission layers 96r, 96g, and 96b of approximately uniform film thickness. Therefore, the organic EL device 84, in which brightness irregularity due to the deposition irregularity is reduced, can be manufactured.

According to the present embodiment, since a necessary amount of liquid is stably supplied to the film formation region A which functions as an application region, the emission layers which have approximately uniform film thickness can be formed on the respective film formation regions if the liquid, supplied in the solidification operation, is solidified. Therefore, brightness irregularity or emission irregularity attributable to the film thickness irregularity of the emission layers is reduced, so that the organic EL device can be manufactured with excellent yield. Further, the organic EL device which can obtain full-colored light emission can be manufactured with excellent yield. Further, even when a necessary amount of liquid supplied to the film formation regions is different from each other, nozzle discharge quantity is appropriately corrected, so that emission layers having desired film thickness can be formed.

Various types of modifications may be conceivable in addition to the above-described embodiments. Hereinafter, modifications will be described.

First Modification

The configuration of the discharge apparatus 10 according to the embodiment is not limited thereto. For example, the allocation of the discharge head 18 provided to the carriage 17 may be varied according to the type of the discharged liquid.

Second Modification

In the droplet discharging method according to the embodiment, the shape and allocation of the film formation region A are not limited thereto. For example, mosaic-type or delta-type allocation can be applied in addition to the stripe-type allocation.

Third Modification

In the method of manufacturing the organic EL device 84 according to the embodiment, the application of the droplet discharging method is not limited to the operation of discharging the liquids 126R, 126G, and 1263 each having a coloration layer formation material. For example, the application of the droplet discharging method can be applied to the operation of discharging the liquid 122 having the hole-injection layer formation material or the liquid 124 having the intermediate layer formation material.

Fourth Modification

In the organic EL apparatus 4 according to the embodiment, the configuration of the emission pixel 76 is not limited thereto. For example, configuration is made such that the organic EL device 84 provided to the emission pixel 76 can emit white light. Further, configuration is made such that three color filters are provided to the side of the sealing substrate 80. Therefore, colors in which brightness irregularity is reduced and visual quality is excellent can be displayed in the same manner.

The entire disclosure of Japanese Patent Application No. 2011-075810, filed Mar. 30, 2011 is expressly incorporated by reference herein.

What is claimed is:

1. A nozzle discharge quantity correction method in which one of a plurality of different driving waveform signals is selected, and the selected driving waveform signals to an actuator of each nozzle of nozzle arrays is supplied, and weight of droplets which is discharged from the nozzle to a discharge region is corrected, the method comprising:
performing first correction calculation in first nozzle array units, in discharge units, or in scanning units on each nozzle to correct a difference between a total sum A of the weight of the droplets which are discharged in second nozzle array units, in the discharge units, or in the scanning units and a predetermined quantity B which should be discharged to the discharge region based on a total sum C of the weight of the droplets in the first nozzle array units, in the discharge units, or in the scanning units
performing second correction calculation in the second nozzle array units, in discharge units, or in scanning units on each nozzle to correct a difference between the corrected total sum C by the first correction calculation and the predetermined quantity B based on the total sum A.

2. The nozzle discharge quantity correction method according to claim 1, wherein an order of the correction quantity calculation of the weight of the droplets is not same as an order of the nozzle array units, the discharge units, or the scanning units from which the droplets are discharged to the same discharge region from the nozzle.

3. The nozzle discharge quantity correction method according to claim 1, wherein selected nozzles in the nozzle array units, the discharge units, or the scanning units in which the droplets are discharged to the same discharge region from the nozzle are not the same.

4. The nozzle discharge quantity correction method according to claim 1, wherein the number of times that the droplets are discharged in the nozzle array units, the discharge units, or the scanning units in which the droplets are discharged to the same discharge region is not the same.

5. The nozzle discharge quantity correction method according to claim 1, wherein the correction of the weight of the droplets for each nozzle is performed by selecting one of the plurality of different driving waveform signals which are arranged in a temporal sequence.

6. A droplet discharging method using the nozzle discharge quantity correction method according to claim 1, comprising:
generating the plurality of different driving waveform signals to be supplied to the actuator of each nozzle based on results of the correction calculation of the performing of the first correction calculation and the performing of the second correction calculation; and
discharging the droplets to the discharge region from the selected nozzle.

7. The droplet discharging method using the nozzle discharge quantity correction method according to claim 2, comprising:
generating the plurality of different driving waveform signals to be supplied to the actuator of each nozzle based on results of the correction calculation of the performing of the first correction calculation and the performing of the second correction calculation; and discharging the droplets to the discharge region from the selected nozzle.

8. The droplet discharging method using the nozzle discharge quantity correction method according to claim 3, comprising:
generating the plurality of different driving waveform signals to be supplied to the actuator of each nozzle based on results of the correction calculation of performing of the first correction calculation and the performing of the second correction calculation; and
discharging the droplets to the discharge region from the selected nozzle.

9. The droplet discharging method using the nozzle discharge quantity correction method according to claim 4, comprising:
generating the plurality of different driving waveform signals to be supplied to the actuator of each nozzle based on results of the correction calculation of the performing of the first correction calculation and the performing of the second correction calculation; and
discharging the droplets to the discharge region from the selected nozzle.

10. The droplet discharging method using the nozzle discharge quantity correction method according to claim 5, comprising:
generating the plurality of different driving waveform signals to be supplied to the actuator of each nozzle based on results of the correction calculation of the performing of the first correction calculation and the performing of the second correction calculation; and
discharging the droplets to the discharge region from the selected nozzle.

11. A method of manufacturing an organic Electroluminescent (EL) device which includes a functional layer having an emission layer in a plurality of film formation regions which are partitioned off on a substrate, using the droplet discharging method according to claim 6, comprising:
discharging liquids, each of which has a functional ingredient, to the plurality of film formation regions; and
solidifying the discharged liquids and forming the functional layer.

12. A method of manufacturing an organic EL device which includes a functional layer having an emission layer in a plurality of film formation regions which are partitioned off on a substrate, using the droplet discharging method according to claim 7, comprising:
discharging liquids, each of which has a functional ingredient, to the plurality of film formation regions; and
solidifying the discharged liquids and forming the functional layer.

13. A method of manufacturing an organic EL device which includes a functional layer having an emission layer in a plurality of film formation regions which are partitioned off on a substrate, using the droplet discharging method according to claim 8, comprising:
discharging liquids, each of which has a functional ingredient, to the plurality of film formation regions; and
solidifying the discharged liquids and forming the functional layer.

14. A method of manufacturing an organic EL device which includes a functional layer having an emission layer in a plurality of film formation regions which are partitioned off on a substrate, using the droplet discharging method according to claim 9, comprising:
discharging liquids, each of which has a functional ingredient, to the plurality of film formation regions; and
solidifying the discharged liquids and forming the functional layer.

15. A method of manufacturing an organic EL device which includes a functional layer having an emission layer in a plurality of film formation regions which are partitioned off on a substrate, using the droplet discharging method according to claim 10, comprising:
discharging liquids, each of which has a functional ingredient, to the plurality of film formation regions; and
solidifying the discharged liquids and forming the functional layer.

16. The method according to claim 11,
wherein in the discharging of the liquid, a plurality of types of liquids which are obtained from different emission colors are discharged to the desired film formation regions, and
wherein in the solidifying of the discharged liquid, the discharged plurality of types of liquids are solidified, and the emission layer of at least three colors, that is, red, green, and blue is formed.

17. The method according to claim 11, wherein in the discharging of the liquid, the plurality of types of liquids to discharge heads which are different from each other are charged, a correction quantity calculation is performed for each liquid, and a driving waveform signal is generated.

* * * * *